(12) United States Patent
Delforce et al.

(10) Patent No.: US 8,995,517 B2
(45) Date of Patent: Mar. 31, 2015

(54) METHOD AND APPARATUS FOR LOCATING FAULTS IN COMMUNICATIONS NETWORKS

(75) Inventors: Greg Delforce, Bulimba (AU); Brendan Horsfield, Rochedale South (AU)

(73) Assignee: Kaelus Pty Ltd, Queensland (AU)

( * ) Notice: Subject to any disclaimer, the term of this patent is extended or adjusted under 35 U.S.C. 154(b) by 43 days.

(21) Appl. No.: 13/811,177

(22) PCT Filed: Jul. 19, 2011

(86) PCT No.: PCT/AU2011/000917
§ 371 (c)(1),
(2), (4) Date: Apr. 4, 2013

(87) PCT Pub. No.: WO2012/009757
PCT Pub. Date: Jan. 26, 2012

(65) Prior Publication Data
US 2013/0182753 A1 Jul. 18, 2013

(30) Foreign Application Priority Data
Jul. 21, 2010 (AU) ................................ 2010903266

(51) Int. Cl.
*H04B 17/00* (2006.01)
(52) U.S. Cl.
CPC .......... *H04B 17/005* (2013.01); *H04B 17/0085* (2013.01)
USPC ........... 375/228; 375/220; 375/221; 375/224; 375/226; 375/295; 375/316
(58) Field of Classification Search
CPC .................................................. H04B 17/005
USPC ......... 375/220, 221, 224, 226, 227, 228, 295, 375/316, 346; 455/230, 295; 324/76, 39, 324/520, 639
See application file for complete search history.

(56) References Cited

U.S. PATENT DOCUMENTS

| | | |
|---|---|---|
| 5,937,011 A | 8/1999 | Carney et al. |
| 8,058,880 B2 | 11/2011 | Bradley et al. |
| 2002/0012404 A1 | 1/2002 | Ahn |
| 2009/0322421 A1 | 12/2009 | Mueller et al. |
| 2010/0164504 A1 | 7/2010 | Bradley |

OTHER PUBLICATIONS

International Search Report from the Australian Patent Office for International Application No. PCT/AU2011/000917, mailed Aug. 29, 2011.

*Primary Examiner* — Leon Flores
(74) *Attorney, Agent, or Firm* — Finnegan, Henderson, Farabow, Garrett & Dunner, LLP

(57) ABSTRACT

The present invention relates to a device for the location of passive intermodulation faults in a coaxial cable network. The test apparatus (100) according to one embodiment of the present invention utilizes a pair of high-power, frequency-synthesized, unmodulated RF carriers $v_1(t)$ (101) and $v_2(t)$ (102) are generated inside the HPA module of the apparatus. The power and frequency of $v_1(t)$ (101) and $v_2(t)$ (102) can be independently set to a range of values, $v_1(t)$, $v_2(t)$ are combined inside the instrument and then applied to the input of the device under test (DUT). The PIM signals (107,108,109) generated in the DUT are combined to produce the primary PIM signal $v_{IM}(t)$ (103). The apparatus also includes two receivers (110,111, 112,113,114,115) for the detection of $v_{IM}(t)$ 103 and $v_{REF}(t)$ (104). These signals are downconverted to 455 kHz. The two 455 kHz waveforms are digitized with a dual-channel A/D converter (116,117) and the amplitude ratio and phase offset between the digitized waveforms are calculated and stored.

31 Claims, 13 Drawing Sheets

METHOD AND APPARATUS FOR LOCATING FAULTS IN COMMUNICATIONS NETWORKS

BACKGROUND OF THE INVENTION

1. Field of the Invention

The present invention relates to a device for the detection of faults in a communications network. In particular although not exclusively the present invention relates to a device for the location of passive intermodulation faults in a coaxial cable network.

2. Discussion of the Background Art

Passive intermodulation distortion (PIM) is a form of electromagnetic interference that is often encountered in radio communications systems such as cellular mobile telephone networks. It can arise wherever there are devices or components with nonlinear transfer characteristics. Examples include oxidised metal-on-metal junctions, components containing ferrites (such as RF circulators), components with sharp metallic edges, loose connectors, and a myriad of other imperfections such as defective plating, dirt and other forms of contamination.

PIM is especially prevalent in full-duplex systems, where the transmitted and received radio signals are diplexed onto the same feeder cable. In such environments the high-power transmit signals generate PIM as they pass through defective components. The PIM signals propagate in two directions:

Towards the antenna in the same direction as the transmit signals (so-called "forward PIM" or "through PIM"); and Back towards the base station ("reflected PIM")

Of the two cases, reflected PIM is usually the greater concern. This is because in many situations the frequency of the PIM signal falls within the passband of the base station's receiver, resulting in loss of sensitivity and an increased bit error rate.

PIM faults in cell sites can be difficult and time-consuming to diagnose and repair. This is because the interconnection between BTS and antenna can consist of multiple components, including feeder cables, diplexers, filters, combiners, jumper cables, masthead amplifiers and bias tees. Furthermore, the radio transceiver and antenna are themselves potential sources of PIM.

The conventional approach to measuring PIM is the so-called two-tone test. This is an industry-standard test that entails applying a pair of high-power carriers (typically +43 dBm each) of different frequencies to the input to the cable network, and measuring the reflected PIM product(s) that land in the cell site's receive band. In theory the two-tone test creates PIM products at an infinite number of discrete frequencies. However, in many (but by no means all) cell sites the only PIM products of interest are the odd-ordered products below the carrier frequencies $F_1$ and $F_2$, as it is these products that are usually responsible for the majority of PIM problems encountered in practice. A simple equation for calculating the frequencies of these products is as follows:

$$F_{IMn} = F_1 - \frac{1}{2}(n-1)(F_2 - F_1)$$

$$n = 3, 5, 7\ldots$$

where $F_{IMn}$=frequency of $n^{th}$ order PIM product located below $F_1$ and $F_2$ $F_1$, $F_2$=frequencies of high-power carriers It must be emphasised that other PIM products besides the odd-ordered products below carrier frequencies $F_1$ and $F_2$ are capable of causing problems in a cell site, depending on the particular spectrum allocation used in the network. For example, some cellular networks are vulnerable to the odd-ordered PIM products located above the transmit band rather than below it.

Similarly, even-ordered PIM products can be problematic in certain circumstances. For example, in a cell site with co-sited GSM900 and PCS1900 systems, the situation could arise in which a second-order PIM product generated by the GSM900 system lands in the receive band of the PCS1900 system.

For the sake of clarity of explanation, the following discussion will focus on a test apparatus that has been designed to measure odd-ordered PIM products below carrier frequencies $F_1$ and $F_2$. However, it shall be understood that the same technique can be used with any measurable PIM product of either odd or even order, at frequencies either above or below the high-power carrier frequencies.

At present the only commercially available instrument for troubleshooting PIM faults in cell sites is the scalar PIM analyser. This is simply a portable two-tone test instrument containing all of the necessary hardware in one box, including frequency synthesisers, high-power amplifiers, triplexer, low-noise receiver and a results display. Two such scalar PIM analysers are discussed in the Applicants co-pending U.S. applications Ser. No. 11/936,968 and U.S. Ser. No. 11/941,712 entitled Passive Intermodulation Test Apparatus the disclosures of which are herein incorporated by reference.

Unfortunately, scalar PIM analysers as discussed in the applicant's earlier applications are only capable of measuring the overall PIM level in a cable network. They do not provide any information about the locations of individual PIM faults. With a scalar PIM analyser there are only two ways of isolating PIM faults:

Percussive testing: This involves tapping every component and cable joint in the network with for example a small rubberised mallet or screwdriver handle, while continuously monitoring the PIM level. Defective components will usually (but not always) cause the PIM level to fluctuate wildly when perturbed in this manner; or Progressive assembly/disassembly of cable network, with PIM testing being performed on the partially assembled network at every stage.

Both of the above approaches are less than optimal. The first method is usually a two-person job, and may require one of the testing personnel to climb the antenna mast in order to locate the source of the PIM fault. Similarly, the second method can also be very labour-intensive and time-consuming, especially in crowded cell sites with large bundles of feeder cables strapped together on the same mast.

Clearly it would be advantageous to provide a system and method for the detection of the location and magnitude of sources of PIM in a communications network with a high degree of reliability and accuracy.

SUMMARY OF THE INVENTION

Disclosure of the Invention

Accordingly in one aspect of the present invention there is provided a test apparatus said apparatus including:

a primary transceiver module including:
  a high power amplifier module for the production of a pair of test signals wherein at least one of the test signals is swept over a predetermined frequency range;
  a combiner module for applying the test signals to a test medium; and
  a primary receiver coupled to the combiner for reception of a plurality of primary return signals produced by the test medium in response to the test signals;
a directional coupler module coupled between the combiner module and the test subject;
a reference signal generation module, said reference signal generation module including:
  a filter module coupled to the directional coupler said directional coupler providing a pair of reference test signals corresponding the pair of test signals produced by said high power amplifier module; and
  a reference signal generator for producing a plurality of reference signals based on pair of reference test signals;
a reference receiver coupled to the filter module for receiving a plurality of reference signals from the reference signal generator;
an analogue to digital converter coupled to the primary receiver and the reference receiver said analogue to digital converter producing a first set of digital signals from the plurality of primary return signals and a second set of digital signals from the plurality of reference signals; and
at least one processor coupled to the analogue to digital converter wherein the least one processor is adapted to digitise and store primary and reference signals for post-processing upon completion of frequency sweep of said test signals.

In another aspect of the present invention there is provided a test apparatus said apparatus including:
a primary transceiver module including:
  a high power amplifier module providing a pair of test signals, wherein at least one of the test signals is swept over a predetermined frequency range;
  a combiner module for applying the test signals to a test medium; and
  a primary receiver coupled to the combiner module for reception of a plurality of primary return signals produced by the test medium in response to the test signals;
a directional coupler module coupled between the combiner module and the test subject;
a reference signal generation module, said reference signal generation module including:
  a filter module coupled to the directional coupler said directional coupler providing a pair of reference test signals corresponding the pair of test signals produced by said high power amplifier module; and
  a reference signal generator for producing a plurality of reference signals based on pair of reference test signals;
a reference receiver coupled to the filter module for receiving a plurality of reference signals from the reference signal generator;
an analogue to digital converter coupled to the primary receiver and the reference receiver said analogue to digital converter producing a first set of digital signals from the plurality of primary return signals and a second set of digital signals from the plurality of reference signals; and
at least one processor coupled to the analogue to digital converter wherein said at least one processor is adapted to:
  determine amplitudes for each signal within the first set of digital signals and the second set of digital signals;
  calculate phase offsets between each signal in the first set of digital signals and the second set of digital signals;
  combine the amplitude and phase measurements for each signal in the first set of digital signals and the second set of digital signals into a single vector;
  estimate from the single vector the number of passive intermodulation sources within the test medium;
  determine for each passive intermodulation source its magnitude and location within the test medium; and
  display the magnitude and location of each passive intermodulation source within the test medium.

In a further aspect of the present invention there is provided a method for determining the location and magnitude of sources of passive intermodulation within a test medium said method including the steps of:
  applying a pair of test signals to the test medium wherein at least one of the test signals is swept over a predetermined frequency range;
  receiving a plurality of primary return signals produced by the test medium in response to the test signals;
  generating a pair of reference test signals corresponding the pair of test signals;
  generating a plurality of reference return signals from the pair of reference test signals;
  compiling a first set of digital signals from the plurality of primary return signals and a second set of digital signals from the plurality of reference signals;
  determining amplitudes for each signal within the first set of digital signals and the second set of digital signals;
  calculating phase offsets between each signal in the first set of digital signals and the second set of digital signals;
  combining the amplitude and phase measurements for each signal in the first set of digital signals and the second set of digital signals into a single vector;
  estimating from the single vector the number of passive intermodulation sources within the test medium;
  determining for each passive intermodulation source its magnitude and location within the test medium; and
  displaying the magnitude and location of each passive intermodulation source within the test medium.

The test apparatus preferably includes a pair of frequency synthesisers for the production of the test signals. Preferably the pair of frequency synthesisers each produce test signals in one or more of the following communications frequencies: 450-460 MHz, 470-500 MHz, 800-830 MHz, 850-870 MHz, 820-850 MHz, 860-900 MHz, 875-880 MHz, 870-900 MHz, 890-910 MHz, 920-925 MHz, 930-940 MHz, 930-960 MHz, 1850-1910 MHz, 1930-1990 MHz, 1430-1440 MHz, 1710-1755 MHz, 2110-2155 MHz, 2110-2170 MHz, 2500-2690 MHz, such as in the 450, 700, 800, 850, 900, 950, 1700, 1800, 1900, 2100, 2500, 450-460 MHz, 470-500 MHz, 800-960 MHz, 1710-2025 MHz, 2110-2200 MHz and 2500-2690 MHz communications bands. Suitably each synthesiser produces test signals in different communications bands. The sweep in test signals frequency may be produced by incrementally stepping the frequency of one of the synthesisers within the chosen communications band while the frequency of the remaining synthesiser remains fixed. Preferably the stepping is in increments of 0.25 MHz.

The primary receiver may include a two-stage downconverter with amplification and filtering at every stage, including the RF, first IF and second IF stages. The combiner module may include a hybrid combiner and a filtering element. The filtering element may be a diplexer or a triplexer.

The apparatus may include a reflectometer for the measurement of vector reflection coefficient. Suitably the reflectometer is a six port reflectometer, although other architectures are possible, such as those using coherent superheterodyne receivers. The reflectometer is coupled between the directional coupler module and the at least one processor. The directional coupler includes at least one reverse coupler and at least two forward couplers. Preferably the reverse coupler and at least one of the forward couplers are coupled to the reflectometer while the remaining forward coupler is coupled to the filter module. In an alternative embodiment the directional coupler could be replaced utilising one forward coupler in combination with a switch or splitter on its output port, so that it can be shared between the reflectometer and reference PIM generator.

The filter module may in one embodiment include a triplexer coupled to the reference signal generator. Alternatively the filter module may in one embodiment include a bandpass filter or diplexer (depending on how the receive spectrum is partitioned) coupled to the reference signal generator, in such instances the reference signal generator is preferably coupled to the forward coupler of the directional coupler via a Low Noise Amplifier (LNA). In another embodiment of the test apparatus the filter module may be replaced with a series of filters, LNAs and at least one mixer, this is particularly the case where the test signals are digitally synthesised.

The primary receiver and reference receiver are each preferably coupled to the analogue to digital converter by anti-aliasing filters. Suitably the anti-aliasing filters are lowpass filters.

The amplitude of the PIM signal may be measured by digitising the Receive Signal Strength Indicator (RSSI) signal at the primary receiver output at every frequency in the predetermined frequency range, and then converting the measured values to dBm using a set of calibration constants stored in the at least one processor. The resulting measurements may then be saved to a results file.

Preferably the calculation of the phase offsets includes determining the absolute phases for each signal within the first and second set of digital signals by performing a least-squares fit of a sinusoidal function to each signal within the first and second set of digital signals; and calculating the difference between the phases of the resultant sinusoidal functions derived from a least-squares process.

The PIM amplitude and phase measurements are combined into a single vector of complex values, one per frequency point.

Suitably the estimation of the number of passive intermodulation sources includes constructing a system of linear prediction equations based on the vector to produce a linear prediction data matrix; performing a singular value decomposition on the linear prediction data matrix to produce a set of singular values; and setting any singular value within the set of singular values to zero if the singular value is less than 10% of the magnitude of the largest singular value within the set of singular values to produce a set of modified singular values.

The calculation of the location and magnitude of each passive intermodulation source may include reconstituting a modified linear prediction data matrix using the set of modified singular values; determining the coefficients of the characteristic polynomial for the modified linear prediction data matrix utilising the Total Least Squares method; calculating the roots of the characteristic polynomial using said coefficients; calculating the location of each passive intermodulation source from said roots; and calculating the magnitude of each passive intermodulation source based on said coefficients and roots utilising the Least Squares Prony method.

In an alternative embodiment, the Total Least Squares Prony method described above could be replaced by a Modified Covariance Estimator, which mathematically extrapolates the measured results over a wider bandwidth. While this technique does not offer the same degree of resolution enhancement as the Total Least Squares Prony method, it is less prone to numerical problems like spectral line-splitting, which can generate non-physical faults that are impossible to distinguish from real ones.

In yet another embodiment, PIM fault locations and amplitudes could be determined using a Periodogram Power Spectral Density Estimator (or simply "periodogram"). The periodogram is a well-known and highly robust estimator, which entails simply taking the inverse Fourier transform of the vector of complex PIM values, thereby producing a range profile that can be displayed on-screen in a graphical format.

Variations on this approach include first applying a window function to the original vector of complex PIM values, and zero-padding the resulting data sequence prior to taking the inverse Fourier transform. This produces a smoother range profile with peaks that are easier to identify, but without the excessively large sidelobes that are usually observed with this type of spectral estimator.

The test medium may be a coaxial cable network, cellular mobile telephone base station, remote radio head or the like.

BRIEF DETAILS OF THE DRAWINGS

In order that this invention may be more readily understood and put into practical effect, reference will now be made to the accompanying drawings, which illustrate preferred embodiments of the invention, and wherein.

DESCRIPTION OF EMBODIMENTS OF THE INVENTION

Figure 1:
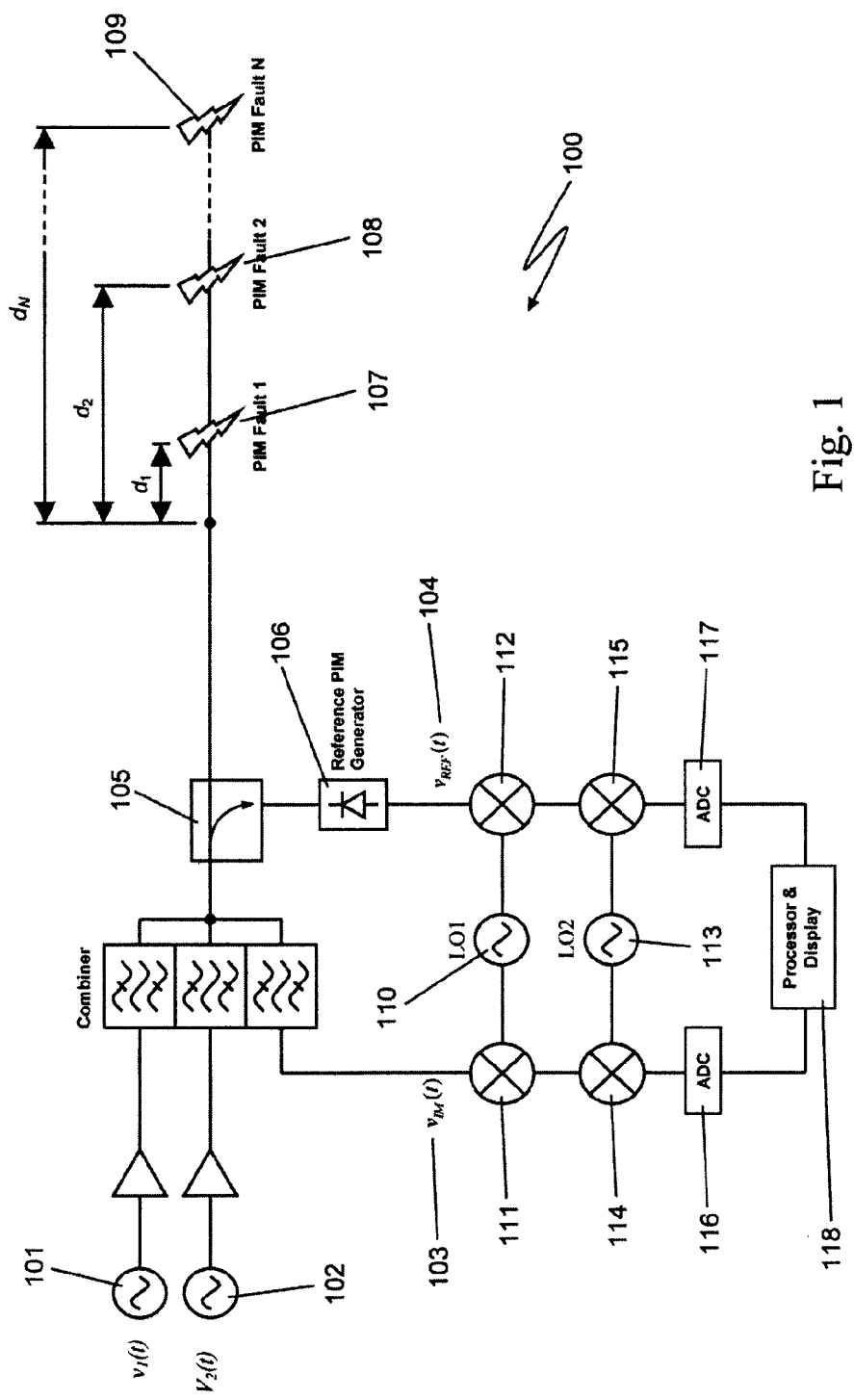
FIG. 1 is a simplified block diagram of the test apparatus according to one embodiment of the present invention.

With reference to FIG. 1 there is illustrated a simplified block diagram of the test apparatus 100 according to one embodiment of the present invention. As shown a pair of high-power, frequency-synthesised, unmodulated RF carriers $v_1(t)$ 101 and $v_2(t)$ 102 are generated inside the HPA module of the apparatus. The power and frequency of $v_1(t)$ 101 and $v_2(t)$ 102 can be independently set to a range of values. $v_1(t)$, $v_2(t)$ are combined inside the instrument and then applied to the input of the device under test (DUT).

$v_{IM}(t)$ 103 is the primary PIM signal. It is the vector sum of all the PIM signals 107, 108, 109 generated in the DUT. It usually has a very low power level (typically much less than −80 dBm). A reference tone $v_{REF}(r)$ 104 is generated inside the apparatus 100. It has the same frequency as the primary PIM signal 103 and is derived by taking a sample of the two high-power carriers $v_1(t)$ 101, $v_2(t)$ 102 via a directional coupler 105 and applying them to a double balanced diode mixer 106 operating near its compression region. In an alternative embodiment the mixer 106 can be replaced by any suitably nonlinear component, including but not restricted to a diode or low noise amplifier operating near its compression region.

The apparatus also includes two receivers 110, 111, 112, 113, 114, 115 for the detection of $v_{IM}(t)$ 103 and $v_{REF}(t)$ 104. These signals are downconverted to 455 kHz via a two-stage downconversion process. In order to maintain phase lock between $v_{IM}(t)$ and $v_{REF}(t)$, the local oscillators 110, 113 in the primary receiver 111, 114 are shared with the reference receiver 112, 115. The two 455 kHz waveforms are digitised with a dual-channel ND converter 116, 117 attached to a Windows PC 118. The amplitude ratio and phase offset between the digitised waveforms are calculated and stored. In an alternative embodiment the two-stage downconverter can be replaced by a single-stage downconverter, provided appropriate changes are made to the ND converter and post-processing software.

The above measurement process is repeated at a range of PIM frequencies. The PIM frequency is set by fixing one of the high-power carriers to a constant frequency, and varying the frequency of the other. It is not important which carrier is fixed and which is swept, as long as the frequency of the PIM signal falls within the passband of the DUT (and of course the apparatus itself).

In most cases the user will be interested in measuring the 3rd-order PIM product, as it usually has the largest amplitude of all the odd-ordered products. However, the apparatus can measure other PIM products as well, such as 5th, 7th, 9th etc as desired. The apparatus also contains a six-port reflectometer, which enables VSWR faults in the DUT to be pinpointed. This information can be used to enhance the accuracy of subsequent distance-to-PIM measurements. In an alternative embodiment the six-port reflectometer can be replaced by any one of several alternative reflectometer designs, including but not restricted to a coherent superheterodyne-based system of the type used in commercial vector network analysers.

Figure 2:
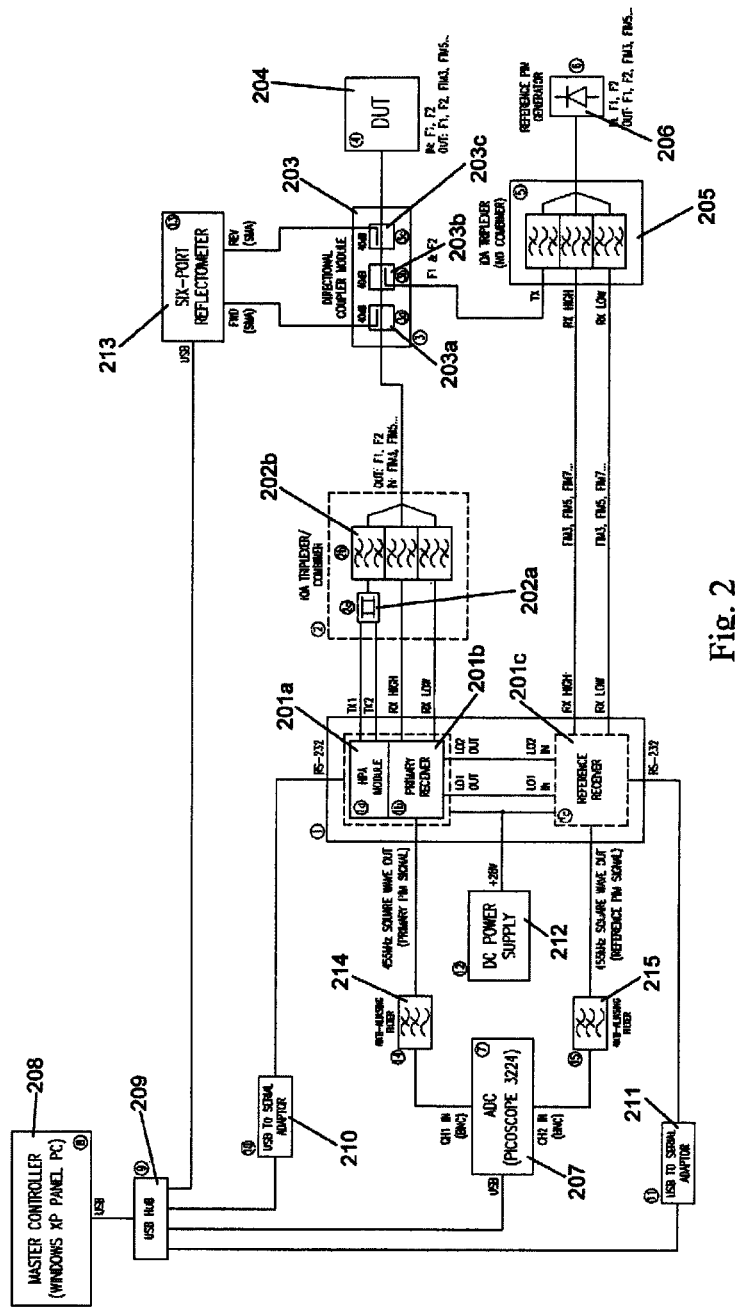
FIG. 2 is a schematic diagram of the test apparatus according to one embodiment of the present invention.

The interconnections between sub-modules of the apparatus 100 are detailed in FIG. 2. As shown the test apparatus 100 includes a collection of distinct sub-modules.

In this particular example the device includes a Control and communications subsystem composed of modules 208, 209, 210, 211, a Primary transceiver stack including modules 201a, 201b, 202a, 202b, Directional coupler module 203, Reference PIM generation subsystem 205, 206, Reference receiver 201c, Data acquisition subsystem 207, 214, 215 and a Reflectometer 213.

All of the apparatus' operations are co-ordinated by the master controller 208. In this instance the master controller is a small Windows XP touch-screen PC integrated into the front panel of the apparatus. The master controller 208 performs three main functions. Firstly, it provides a Windows-style user interface that enables the operator to configure, start and stop the measurement process. Secondly, it coordinates and manages the operation of all of the sub-modules in the system during the measurement process. Finally, the master controller 208 post-processes the measured PIM data in order to compute PIM fault locations & magnitudes.

The master controller 208 has a total of four USB-based communications links into the system, connected via a 4-port powered USB hub 209 and two USB-to-Serial adaptors 210, 211. One USB connection is provided for the primary transceiver stack composed of modules 201a, 201b and 202; reference receiver 201c; analogue-to-digital converter 207; and reflectometer 213.

The PIM measurement process starts with the high-power amplifier module (HPA) 201a. The HPA module utilised in this instance is of a similar construction to the HPA module discussed in the applicant's earlier filed applications U.S. Ser. No. 11/936,968 and U.S. Ser. No. 11/941,712 the disclosures of which are herein incorporated by reference. The HPA module 201a typically comprises a pair of PLL-synthesisers followed by a pair of RF amplifiers. The synthesisers can be individually programmed to any frequency in the AWS & PCS transmit bands (i.e. 1930-2155 MHz), in increments of 5 kHz. The synthesisers share a common 10 MHz reference, and are operated in a simple, unmodulated continuous-wave (CW) mode. The RF amplifiers are each capable of generating +36 to +46 dBm ms of continuous RF power, which can be set in increments of 0.1 dB. The power of each carrier is continuously monitored by a microcontroller, which can adjust a pair of variable attenuators (one per channel) at the input to the HPA to maintain the desired output power level.

For ease of description the two high-power carriers generated by the HPA will be referred to in the following discussion as $Tx_1$ and $Tx_2$, with frequencies of $F_1$ and $F_2$ respectively. As shown $Tx_1$ and $Tx_2$ are applied to the inputs of a hybrid combiner 202a of combiner module 202, each port of the hybrid combiner 202a in this instance is followed by an isolator capable of absorbing the full RF power output of the HPA 201a in the event of an open or short-circuit condition on the test port of the system.

As the two carriers $Tx_1$ and $Tx_2$ pass through the combiner to its output port, half their power is dissipated in a high-power resistor connected to the isolated port of the combiner. As a result the maximum power that the apparatus 100 can produce at its test port is +43 dBm per carrier. While inefficient in terms of power consumption, this approach enables the frequencies $F_1$ and $F_2$ of the two carriers to be swept over the full 1930-2155 MHz transmit band without restriction.

The output port of the combiner is connected to the Tx port of the triplexer 202b. The triplexer 202b comprises three low-loss combline filters (one Tx, two Rx) connected together at a common port. The bandwidth of the Tx filter covers both the AWS and PCS transmit bands (i.e. 1930-2155 MHz). The triplexer's two receive filters are used to capture the reflected PIM signals from the device under test (DUT) 204. One filter covers the AWS Rx band (1710-1755 MHz), while the other covers the PCS Rx band (1850-1910 MHz). The triplexer provides very high isolation (95 dB min) between the Tx and Rx filters. This is so that the high-power carriers $Tx_1$ and $Tx_2$ do not leak through the receive filters and overload the primary receiver 201b. Great care is taken when the triplexer is manufactured to ensure that its residual PIM level is very low (−120 dBm max). This is critical in minimising the baseline PIM level of the apparatus 100, thereby maximising the sensitivity of the instrument as a whole.

The directional coupler module 203 is attached directly to the output port of the triplexer 202b. It contains two forward couplers 203a, 203b and one reverse coupler 203c. All couplers 203a, 203b, 203c have a coupling loss of approximately 40 dB. The directivity of each coupler 203a, 203b, 203c is tuned to at least 20 dB across the entire transmit band (1930-2155 MHz). The outputs from the first forward coupler 203a and reverse coupler 203c are connected to the six-port reflectometer 213. The output from the second forward coupler 203b is used to generate a reference PIM signal which is discussed in greater detail below.

The device under test (DUT) 204 is attached to the output port of the directional coupler module 203. The DUT will typically take the form of a coaxial cable network of the type found in cellular mobile telephone base stations. These cable networks usually consist of several devices connected together in cascade, including low-loss feeder cables, diplexers, filters, combiners, jumper cables, masthead amplifiers and bias tees. Any one of these components may be a source of PIM. The cable network is terminated in one or more antennas installed in an elevated location like a mast or rooftop. Like every other component in the system, the antennas are also potential sources of PIM.

As the two high-power carriers $Tx_1$ and $Tx_2$ propagate through the cable network, PIM is generated by the faulty devices in the system. The PIM signals then propagate in two directions: towards the antenna, and back towards the test apparatus where they are measured and analysed. Due to small impedance mismatches in the cable network, some of the power in the high-power carriers $Tx_1$ and $Tx_2$ will also be reflected back towards the test apparatus 100. The reflected PIM signals generated inside the DUT propagate back through the directional coupler module 203 and into the common port of the triplexer 202b. The PIM signals pass through whichever receive filter's passband they reside in, and into the primary receiver 201b.

The primary receiver 201b in this instance contains a two-stage downconverter with amplification and filtering at every stage, including the RF, first IF and second IF stages. In this case the second IF bandwidth of the receiver is 11 kHz, while the nominal noise floor is better than −130 dBm. A solid-state switch at the input enables the receiver to switch between the AWS and PCS outputs from the triplexer 202b. The primary receiver 201b can be tuned to detect PIM at any frequency in either of the two receive bands. This includes not only the $IM_3$ products, but also any higher-order PIM products that happen to fall in the AWS or PCS receive bands, such as $IM_5$, $IM_7$, $IM_9$ etc, provided of course that these signals are above the noise floor of the receiver 201b. This enables the test apparatus 100 to pinpoint PIM faults and cross-check results using a variety of PIM products, or even combinations of products of different orders. A variable attenuator is located in the first IF stage of the receiver 201b so that the PIM signal level can be adjusted to avoid overloading the amplifier in the second IF stage.

The primary receiver produces two outputs: an RSSI signal and a 455 kHz square wave. The RSSI signal is a DC voltage that is proportional to the power (in dBm) in the PIM signal. The 455 kHz square wave is simply a clipped version of the downconverted PIM signal. The 455 kHz square wave is produced by the limiting amplifier in the second IF stage of the receiver 201b, and contains all of the phase information in the unclipped signal but with the amplitude content removed.

The RSSI signal is then digitised and reported to the master controller 208 via a USB link. The master controller 208 converts the measured RSSI value into a scalar PIM level in dBm using a set of calibration constants stored on its hard drive. The 455 kHz square wave is used to measure the phase of the PIM signal. This is achieved by passing the square wave through a low-pass filter 214 and digitising the resultant sine wave with an analogue-to-digital converter (ADC) 207.

In order to measure the phase of the primary PIM signal at any given frequency, a local reference signal is required at the same frequency. It is not important how the reference signal is generated, provided it is stable, repeatable, and phase-locked to the primary PIM signal. In the present example the reference PIM signal is derived from the same pair of high-power carriers $Tx_1$ and $Tx_2$ that generate the primary PIM signal in the DUT.

The first step in generating the reference PIM signal is to take a sample of the high-power carriers $Tx_1$ and $Tx_2$. This is achieved using the forward directional coupler 203b. As noted above the coupling loss of the coupler is approximately 40 dB. At full power, each of the original carriers will have a level of +43 dBm. Therefore the sampled versions of $Tx_1$ and $Tx_2$ (hereinafter referred to as $Tx_{1ref}$ and $Tx_{2ref}$) each have a level of around +3 dBm at the output of the directional coupler 203b.

The sampled carriers $Tx_{1ref}$ and $Tx_{2ref}$ are then passed to the Tx port of a reference triplexer 205. Its purpose is twofold: Firstly, the Tx filter in the triplexer 205 prevents the reference PIM signals from coupling back into the test port of the test apparatus 100 and interfering with the primary PIM signal from the DUT 204. Secondly, the Rx filters in the triplexer 205 prevent $Tx_{1ref}$ and $Tx_{2ref}$ from entering the reference receiver 201c and overloading it.

After passing through the Tx filter of the reference triplexer 205, the sampled carriers $Tx_{1ref}$ and $Tx_{2ref}$ enter the reference PIM generator 206. In this instance the reference PIM generator is simply a surface-mount double balanced diode mixer (e.g. Mini-Circuits ADE-35MH+). The sampled carriers $Tx_{1ref}$ and $Tx_{2ref}$ are applied to the RF port of the mixer while the LO and IF ports of the mixer are terminated in 50 ohm loads. When $Tx_{1ref}$ and $Tx_{2ref}$ are applied to the mixer's RF port, a very large number of PIM products are generated. This is because mixers are inherently highly nonlinear devices. The power level of the PIM signals generated in the mixer varies greatly from PIM product to PIM product. For example, when the test apparatus is run at full power, the reference $IM_3$ product is typically around −75 dBm in the AWS and PCS bands, whereas the reference $IM_5$ product is around −90 dBm. This difference does not adversely affect the operation of the test apparatus 100, as both products are well within the dynamic range of the receiver. Moreover as the test apparatus is calibrated separately for each PIM product, any differences in the behaviour of the products over frequency are accounted for.

The fact that both the primary $v_{IM}(t)$ and reference $v_{REF}(t)$ PIM signals are derived from the same pair of high-power carriers $Tx_1$ and $Tx_2$ confers several performance advantages on the system as a whole. Firstly, the reference PIM signals $v_{REF}$ generated in the mixer are phase-locked to the primary PIM signals $v_{IM}(t)$ generated in the DUT 204. This is essential in any coherent ranging system. Secondly, any changes in the absolute phases of the two high-power carriers $Tx_1$ and $Tx_2$ are tracked equally by both the primary $v_{IM}(t)$ and reference $v_{REF}(t)$ PIM signals. This is particularly important as the HPA module 201a heats up during extended periods of operation, thereby causing its phase response to change over time. By using the same pair of carriers to generate both the primary $v_{IM}(t)$ and reference $v_{REF}(t)$ PIM signals, any change in the phase response of the HPA 201a is automatically cancelled out. An added benefit is that the phase detection algorithm used by the test apparatus does not need to be temperature compensated.

The reference PIM signals $v_{REF}(t)$ generated in the mixer travel back out the mixer's RF port and into the reference triplexer 205. They then pass through either the AWS- or PCS-band receive filters (depending on their frequency), and into the reference receiver 201c. The reference receiver is almost identical to the primary receiver 201b. The only difference is that reference receiver does not have its own local oscillators. Instead, the local oscillators from the primary receiver 201b are shared with the reference receiver 201c. This improves the phase noise performance of the system by 3 dB. It also eliminates the ±180° phase ambiguity in the measured PIM phase that can occur when two separate pairs of local oscillators are used. All other aspects of the reference receiver are identical to the primary receiver.

At any given frequency, the phase of the measured PIM signal is defined as the phase difference between the primary $v_{IM}(t)$ and reference $v_{REF}(t)$ PIM signals. This quantity is measured by digitising the 455 kHz square wave outputs from the primary 201b and reference 201c receivers, and calculating the phase difference between the signals.

The first step in the digitisation process is to pass the square waves through a pair of low pass anti-aliasing filters 214, 215. These are implemented using a combination of op-amp-based active filters and passive ceramic filters. Each anti-aliasing filter 214, 215 attenuates all of the harmonics of the square wave above the fundamental frequency by at least 30 dB, thereby converting each square wave into a close approximation to a sine wave. This enables the sampling rate of the analogue-to-digital converter to be minimised without introducing aliasing artefacts into the digitised data.

The outputs from the anti-aliasing filters 214, 215 are passed to a two-channel analogue-to-digital converter (ADC) 207. In this instance the ADC is a PicoScope 3224 USB oscilloscope, providing 12 bits of resolution at up to 10 megasamples per second simultaneously on both channels. It will of course be appreciated by those of skill in the art that a lower spec ADC would work equally well in this application. The minimum recommended ADC requirements are 10-bit resolution at 2 megasamples per second.

At each point in the frequency sweep, the ADC takes 2200 samples of each PIM signal at a rate of 10 megasamples per second. This is equivalent to approximately 100 complete cycles of each 455 kHz waveform. The sampled waveform data is then transferred from the storage buffer of the ADC to the master controller PC 208, where it is stored in readiness for further processing.

A potential source of error that can arise in the distance to PIM measurement process is the presence of impedance mismatches in the DUT 204. These can manifest themselves in at least two ways:

Amplitude ripple (and possibly phase ripple) in swept PIM measurements: High-power RF signals propagating on mismatched cable networks form standing waves, with stationary peaks & nulls along the length of the cable. This can affect the strength of any PIM signals generated within the network. Compounding this problem is the fact that as one carrier is swept over a range of frequencies, the standing wave envelope moves proportionately, producing ripple on the amplitude (and possibly phase) of the measured PIM signal from one frequency to the next.

Ghost PIM sources: As a PIM signal propagates through the DUT, any impedance mismatches in the network will cause some of the signal to reflect back in the opposite direction. Multiple mismatches will cause multiple reflections. If the mismatches are large enough, the multiple reflections will show up as spurious or "ghost" PIM sources during post-processing. Depending on the severity of the original PIM source, these ghost sources could appear to be quite large (although not larger than the original PIM source).

To mitigate impedance-related accuracy problems, the test apparatus 100 employs a six-port reflectometer 213. This is a circuit that enables accurate vector reflection coefficient measurements to be made using simple and cheap scalar components. The six-port reflectometer takes the signals from the forward and reverse directional couplers 203a and 203c respectively, and creates four linear combinations of these signals in a six-port junction of a similar topology to that proposed in at least "The six-port reflectometer: An alternative network analyzer," *IEEE Trans. Microwave Theory Tech.*, vol. MTT-25, pp. 1075-1080, December 1977 to G. F, Engen.

The four outputs from the six-port junction are converted into DC voltages using an RF detector that is switched between each output in turn. An on-board microcontroller then reports these voltages back to the master controller 208 via a USB link, where they are converted into a corresponding vector reflection coefficient using a set of calibration constants. In the present example the six-port reflectometer 213 can measure the vector reflection coefficient of the DUT 204 at any frequency in the Tx band of the instrument (i.e. 1930-2155 MHz). By measuring the reflection coefficient at multiple frequency points across the Tx band, it is possible to estimate the location and severity of any impedance mismatches in the DUT 204. This technique is commonly referred to as Frequency Domain Reflectometry (FDR), and is mathematically very similar to the method used in measuring distance-to-PIM.

Distance-to-VSWR fault information can be used to enhance the accuracy of the test apparatus' 100 measurements in two ways:

Pre-testing of DUT 204 to detect gross VSWR faults: In real-world applications it is recommended that the operator performs a distance-to-VSWR sweep on the DUT 204 prior to any distance to PIM testing. This enables any serious VSWR problems to be resolved first, thereby improving the accuracy of subsequent distance to PIM measurements.

Incorporation into distance to PIM signal-processing software: Work is currently underway to incorporate distance-to-VSWR information into the distance to PIM fault-finding algorithm. This is actually a rather difficult theoretical problem, so a compromise solution may be to consider only the worst VSWR fault. This is a simpler proposition which would still provide some accuracy enhancement.

At its maximum rated RF output the test apparatus 100 requires 650 W of AC mains power. This is provided by an off-the-shelf power supply module 212 from Cosel (pin PBA600E-24) that converts mains power to 28V DC. This DC voltage is then converted to a range of other voltage levels elsewhere in the system in order to power each sub-module.

Prior to use the test apparatus needs to be properly calibrated in order to correct for systematic measurement errors and to establish a reference plane for the system.

Calibration of the HPA module is achieved by connecting an external power meter to the test port of the test apparatus and monitoring the true power of the carriers $Tx_1$ and $Tx_2$ as they are swept over the test apparatus' full range of operating frequencies and power levels. The HPA is equipped with on-board RF detectors that facilitate closed-loop control of the output power of each carrier. These detectors are internally temperature compensated, so that they return reliable power estimates over the rated operating temperature range of the instrument.

The primary and reference receivers 201b, 201c in the test apparatus 100 are each subjected to two separate calibration procedures. The first is an amplitude-only calibration that characterises the receivers' power monitors, while the second is a phase-only calibration that establishes a reference plane for the system.

The power calibration procedure entails connecting an external signal generator to the common ports of the primary and reference triplexers 202b, 205 in turn, and injecting an Rx-band tone of known frequency and power. The RSSI signal at the output of the receivers 201b, 201c is then recorded. This process is repeated at a large number of frequencies and power levels, with the results being stored in a lookup table on the hard drive of the master controller 208.

The phase calibration procedure establishes a reference plane for the test apparatus 100. The first step in this process is to attach a strong, stable PIM source directly to the test port of the instrument. One example of such a load is the applicant's own standardised PIM source referred to as Sabre Source (p/n PIS0002F1V1). The Sabre Source consists simply of a high-power 50 ohm resistor which produces approximately −77 dBm of $IM_3$ with two +43 dBm carriers.

Next, a swept PIM measurement is performed across both the AWS and PCS receive bands, with the phase offset between the primary and reference PIM signals being recorded at each frequency point. Finally, the measured phase offsets are stored to a file on the hard drive of the master controller PC 208. When performing distance-to-PIM measurements on a DUT 204, these phase offsets are subtracted from the DUT 204 phase measurements, effectively normalising the results to the test port of the test apparatus.

Figure 3:
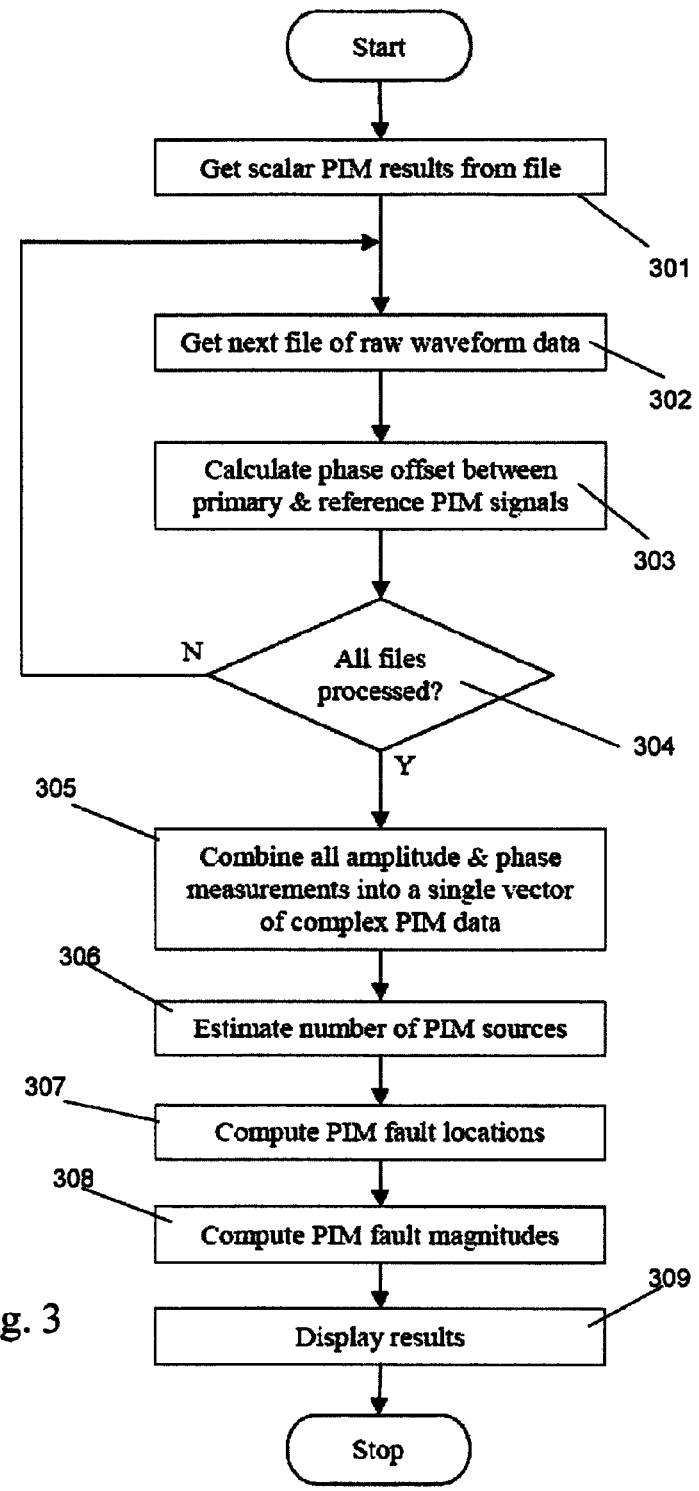
FIG. 3 is a flow chart depicting the process of calculating the distance to the fault according to one embodiment of the invention.

FIG. 3 depicts one example of the processing algorithm utilised by the test apparatus 100 to convert the raw PIM data to the desired distance measure. The raw data from the measurement process produces a list of scalar PIM measurements, one per frequency, and a set of files containing the digitised PIM waveform data, with one file for each frequency point in the sweep. This data is stored on the hard drive of the master controller PC 208.

The processing algorithm firstly reads in the scalar PIM measurements 301 from master controller PC 208 hard drive. These measurements contain amplitude-only information about the primary PIM signal, derived from the RSSI signal at the output of the primary receiver at each point in the frequency sweep.

The processing algorithm then proceeds to read in the files of digitised waveform data for both the primary and reference PIM signals 302. One file exists for every point in the frequency sweep. As each file is read in, the absolute phases of the primary and reference PIM signals are calculated by performing a least-squares fit of a sinusoidal function to the waveform data. This method provides the dual benefits of very high phase resolution and automatic smoothing of any noise or residual distortion from unfiltered harmonics in the original 455 kHz square waves. The phase offset between the primary and reference PIM signals is then computed 303 by taking the difference between the phases of the two sinusoidal functions derived from the least-squares process.

The algorithm then determines whether all the waveform data has been processed 304 and if so the algorithm then combines the amplitude and phase measurements into a single vector of complex values, one per frequency point 305. Each value in the vector is calculated according to the following equation:

$$H_n = \sqrt{2Z_0 P_n} \exp(j\theta_n)$$

where $H_n$=nth point in complex PIM data sequence
$P_n$=power of primary PIM signal (in watts rms) at nth point in sweep
$\theta_n$=phase offset (in radians) between primary & reference PIM signals at nth point in sweep; and
$Z_0$=characteristic impedance of system (50 ohms)

For best results the signal processing software requires an estimate of the number of PIM faults in the DUT 204. Several techniques are available to this end. The preferred approach in the present case is to construct a system of linear prediction (LP) equations based on complex PIM vector $H_n$. A singular value decomposition (SVD) is then performed on the LP data matrix. The resulting set of singular values is analysed, and any values that are less than 10% of the magnitude of the largest singular value are set to zero. At the end of this process, the number of nonzero singular values will be equal to the number of PIM faults in the DUT 204.

Once the number of PIM faults has been estimated 306, the modified LP data matrix is reconstituted using the modified singular values from the previous step. Due to the fact that some of the singular values were set to zero in the previous step, the reconstituted LP data matrix has a lower noise content than the original matrix. This ultimately leads to improved accuracy in the estimated PIM fault locations. The system of LP equations is then solved for the coefficients of the characteristic polynomial using the method of Total Least Squares. This approach is favoured in the current invention because it performs well with weak signals in noisy environments, where the measured data sequence is short.

Having found the coefficients of the LP equations, the zeros of the characteristic polynomial are calculated. The locations of the PIM faults in the DUT 204 can then be computer directly from these zeros 307.

The magnitude of each PIM fault is determined 308 via the Least Squares Prony method, using the LP coefficients and polynomial zeros computed in the previous steps.

In an alternative embodiment, the Total Least Squares Prony method described above could be replaced by a Modified Covariance Estimator, which mathematically extrapolates the measured results over a wider bandwidth. While this technique does not offer the same degree of resolution enhancement as the Total Least Squares Prony method, it is less prone to numerical problems like spectral line-splitting, which can generate non-physical faults that are impossible to distinguish from real ones.

The first step in creating a Modified Covariance Estimator is to construct a system of forward and backward linear prediction equations based on complex PIM vector $H_n$.

The second step is to solve the system of equations for the coefficients of the characteristic polynomial. This can be performed using either a conventional least-squares method, or more sophisticated techniques like SVD analysis followed by Total Least Squares as described above.

The third step is to substitute the resulting coefficients into the characteristic polynomial and verify that produces a stable linear prediction filter. This entails solving for the roots of the characteristic polynomial and ensuring that all lie inside the unit circle. Any poles found outside the unit circle can be moved inside it by simply inverting their magnitudes, thereby guaranteeing the stability of the filter.

The fourth step is use the linear prediction filter to extrapolate the measured data over a wider bandwidth. This entails substituting the measured data into the linear prediction filter, which then predicts the PIM at the first frequency point outside the measured range. The predicted value can then be substituted back into the filter as if it were a measured data point, and used to predict the value at the second frequency point outside the measured range. This process is repeated in both the forward direction (i.e. increasing frequency) and backward direction (i.e. decreasing frequency), until the measured data has been extrapolated over a sufficient bandwidth to provide the required spatial resolution.

The final step is to take the inverse Fourier transform of the extrapolated data sequence, which produces a range profile that can be displayed on-screen in a graphical format.

In yet another embodiment, PIM fault locations and amplitudes could be determined using a Periodogram Power Spectral Density Estimator (or simply "periodogram"). The periodogram is a well-known and highly robust estimator, which entails simply taking the inverse Fourier transform of the vector of complex PIM values, thereby producing a range profile that can be displayed on-screen in a graphical format. Variations on this approach include first applying a window function to the original vector of complex PIM values, and zero-padding the resulting data sequence prior to taking the inverse Fourier transform. This produces a smoother range profile with peaks that are easier to identify, but without the excessively large sidelobes that are usually observed with this type of spectral estimator.

The results calculated by the signal processing software are displayed on the screen of the master controller PC 208. Some examples of how these plots might look are presented in FIGS. 5, 7, 10A, 10B, 10C and 10D. In each case, the results of the Total Least Squares Prony method are plotted as a set of discrete markers, while the results of the Modified Covariance Estimator are plotted as a continuous line.

If desired, the system will generate a report for the user in Excel or PDF format, complete with a time/date stamp and geographical location information (provided by the user).

It will of course be appreciated by those of skill in the art that there are a number of alternate methods of phase detection besides the least squares fit of a sinusoidal function described above. One such alternative is to use an analogue I/Q demodulator. This is a well-known circuit that is widely used in communications systems. Under this technique, the phase offset between the primary and reference PIM signals is measured by splitting the 455 kHz square wave output from the primary receiver into two paths, which are connected to the input ports of a pair of mixers (designated "I" and "Q").

Likewise the 455 kHz square wave output from the reference receiver is split into two paths. One path is connected directly to the LO port of the "I" mixer. The other path is connected to a 90° phase shifting network, and then to the LO port of the "Q" mixer. The outputs from the "I" and "Q" mixers are lowpass filtered to remove any AC components from the signals, leaving two DC voltages designated $V_I$ and $V_Q$.

$V_I$ and $V_Q$ are digitised using either a pair of ADCs, or a single ADC that is switched between the two outputs. Finally, the phase offset Δθ between the primary and reference PIM signals is calculated using the following expression:

$$\Delta\theta = \arctan\left(\frac{V_Q}{V_I}\right)$$

An alternative to the analogue I/Q demodulator for measuring the phase offset between the primary and reference PIM signals is to utilise a digital I/Q demodulator. This approach is functionally identical to the analogue I/Q demodulator described above, except that the mixing and lowpass filtering operations are performed digitally using an FPGA or DSP.

Under the digital approach 455 kHz square wave output from the primary and reference receivers are lowpass filtered by a pair of anti-aliasing filters e.g. 214, 215 per the above discussion of FIG. 2. The outputs from the anti-aliasing filters are digitised using a pair of ADCs having a sampling rate of at least 2 MSa/sec at 10 bit resolution. Each pair of primary & reference waveform samples is stored in the input buffer of an FPGA or DSP module. Each pair of primary and reference waveform samples is multiplied together inside the digital processing module to create an "I" product.

At the same time, each primary waveform sample is multiplied by a 90° phase-shifted version of the reference waveform sample, thereby creating a "Q" product. The streams of "I" and "Q" products are lowpass filtered using a digital FIR filter to remove the AC components from the sampled data sequences. This yields two streams of scalar constants, designated $V_I$ and $V_Q$. Finally, the phase offset Δθ between the primary and reference PIM signals is calculated using the following expression:

$$\Delta\theta = \arctan\left(\frac{V_Q}{V_I}\right)$$

Yet another alternative method of measuring the phase offset between the primary and reference PIM signals is to use a phase-frequency detector IC of the type commonly used in phase-lock loop applications. One example is the MCH12140 chip from ON Semiconductor. This device takes the square wave outputs directly from the primary and reference receivers, and produces a pair of pulse width modulated (PWM) output signals with duty cycles proportional to the phase offset between the two input signals. The pair of PWM voltages are subtracted from each other in a differential amplifier, and lowpass filtered to eliminate the AC component from the output signal. The resultant signal is a DC voltage proportional to the phase offset between the primary and reference PIM signals. The measurable range of phase offsets is −180° to +180°. The DC output voltage from this circuit is digitised using a single ADC, and converted to a corresponding phase offset in degrees or radians via a set of calibration constants stored on the hard drive of the master controller.

Figure 4:
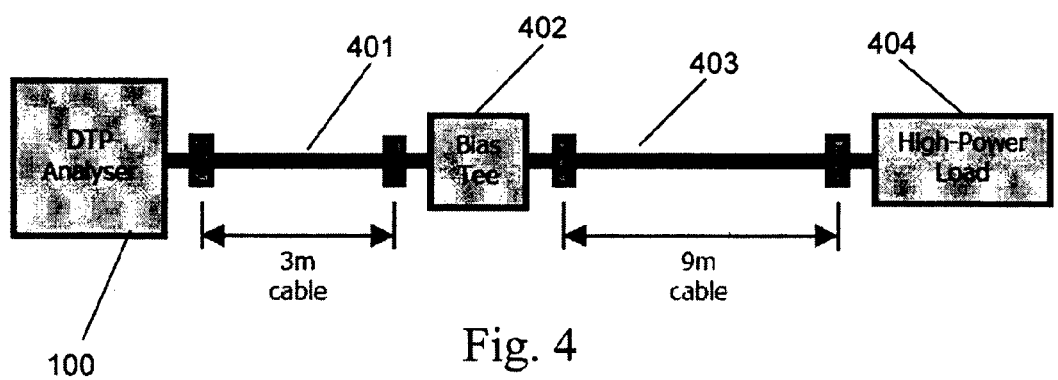
FIG. 4 is a schematic diagram of an experimental arrangement for the detection of PIM sources at varying distances from the test apparatus.

FIG. 4 depicts an experimental setup utilised to test the performance of the test apparatus 100. As shown the apparatus is coupled to a Bias Tee 402 via a 3 m length of cable 401. The Bias Tee 402 is in turn coupled to a high power load 404 via a 9 m length of cable 403. Thus the total distance from the test apparatus to the high power load is approximately 12 m. The PIM for the tee 402 and the high power load 404 are also known, in this case the bias tee 402 has a PIM rating of −86 dBm and the high power load 404 has a PIM rating of −100 dBm.

The two high power carriers $Tx_1$ and $Tx_2$ from the test apparatus, each having a power of +38 dBm, are then applied to the high power load 404 via the cable network consisting of the 12 meters of cable 401, 403 and bias tee 402. The high power carrier $Tx_1$ in this instance was swept across a 20 MHz bandwidth at 0.25 MHz increments while $Tx_2$ remained fixed.

Figure 5:
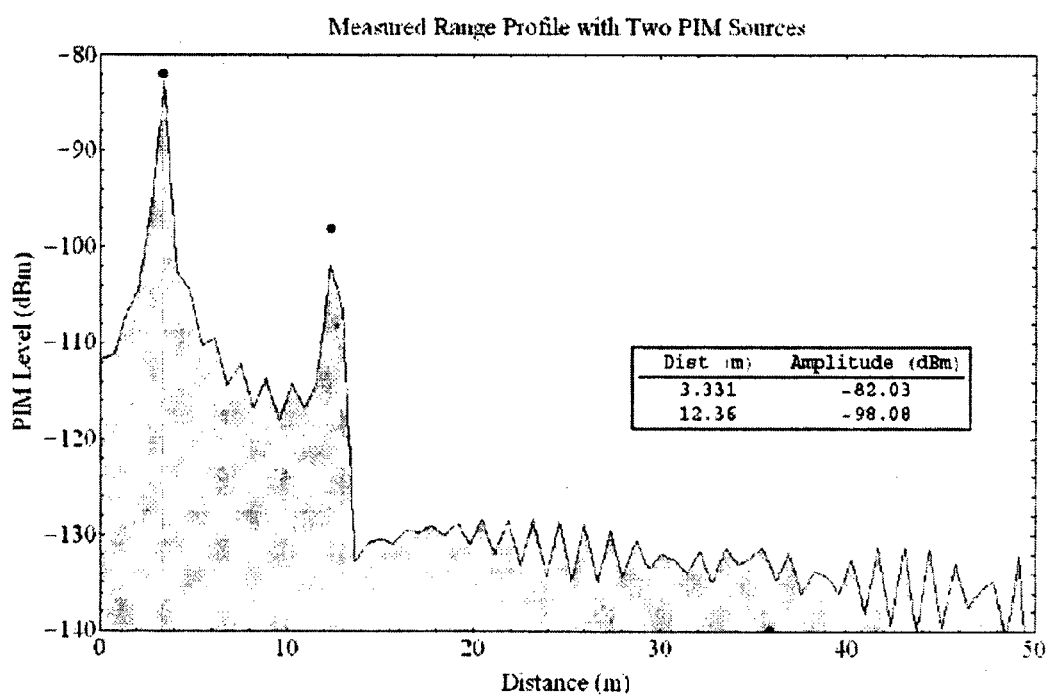
FIG. 5 is a plot of the results of the experiment utilising the arrangement of FIG. 4.

The results from the test of the cable network of FIG. 4 are shown in FIG. 5. As can be seen two dots are displayed on the range profile plot produced from the PIM signals generated in the cable network of FIG. 4. These two dots represent the values of the distance to the PIM faults as produced by the Total Least Squares Prony Estimator algorithm discussed above. As can be seen the results produced by the test apparatus identifies two PIM faults one at 3.331 m at a value of −82.03 dBm which corresponded to the PIM of the bias tee 402. The second fault detected by the test apparatus is located at a distance of 12.36 m with a value of −98.08 dBm which corresponds to the PIM of the high power load 404. Also displayed in FIG. 5 is a line plot of PIM versus distance. This line plot is generated by the Modified Covariance Estimator algorithm discussed above.

Figure 6:
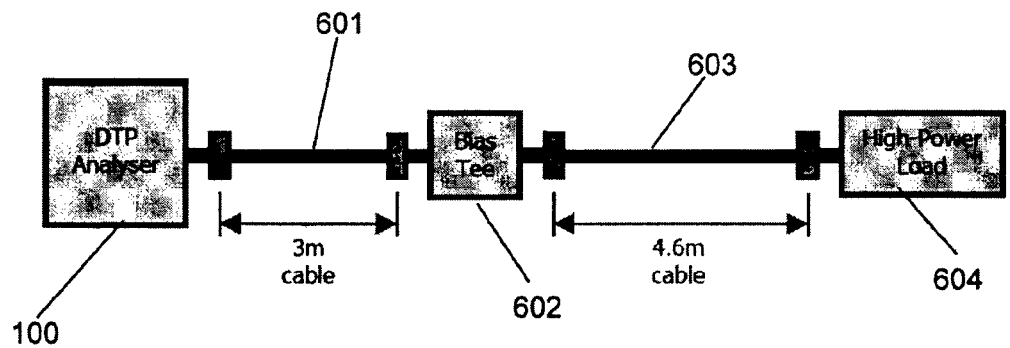
FIG. 6 is a is a schematic diagram of an experimental arrangement for the detection of PIM sources at varying distances from the test apparatus.

FIG. 6 depicts a second experimental setup utilised to test the performance of the test apparatus 100. As shown the apparatus is coupled to a Bias Tee 602 via a 3 m length of cable 601. The Bias Tee 602 is in turn coupled to a high power load 604 via a 4.6 m length of cable 603. Thus the total distance from the test apparatus to the high power load is approximately 7.6 m. The PIM for the tee 602 and the high power load 604 are also known, in this case the bias tee 602 has a PIM rating of −77 dBm and the high power load 604 has a PIM rating of −73 dBm.

The two high power carriers $Tx_1$ and $Tx_2$ from the test apparatus, each having a power of +3dBm, are then applied to the high power load 604 via the cable network consisting of the 7.6 meters of cable 601, 603 and bias tee 602. The high power carrier $Tx_1$ was then swept across a 20 MHz bandwidth at 0.25 MHz increments while $Tx_2$ remained fixed.

Figure 7:
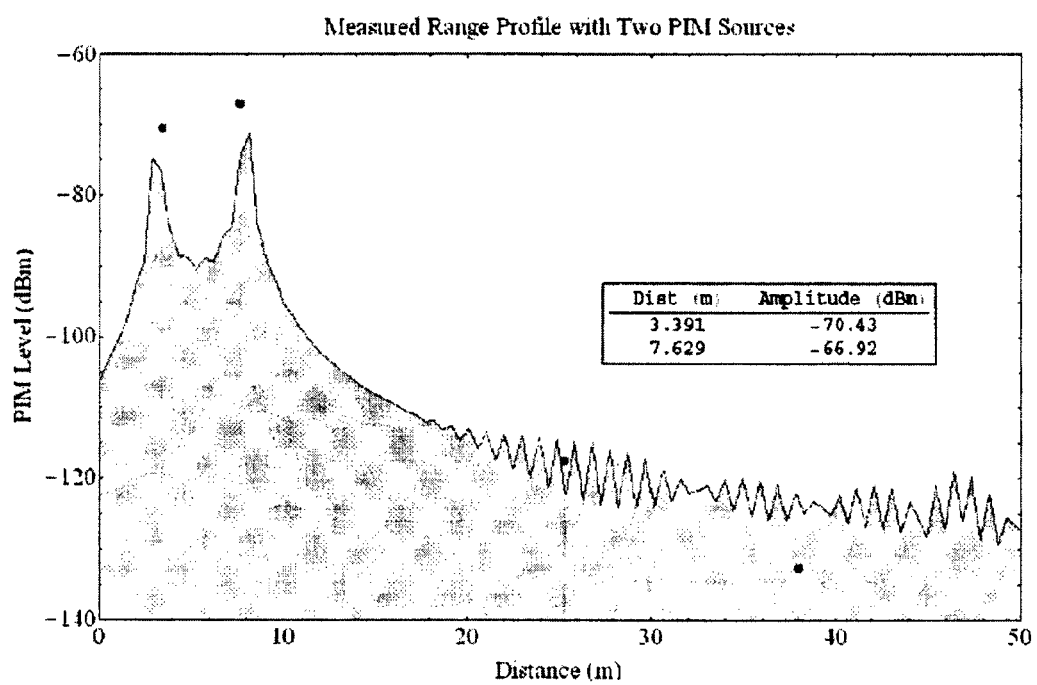
FIG. 7 is a plot of the results of the experiment utilising the arrangement of FIG. 6.

The results from the test of the cable network of FIG. 6 are shown in FIG. 7. As can be seen two dots are displayed on the range profile plot produced from the PIM signals generated in the cable network of FIG. 7. These two dots represent the values of the distance to the PIM faults as produced by the Total Least Squares Prony Estimator algorithm discussed above. As can be seen the results produced by the test apparatus 100 identifies two PIM faults, one at 3.391 m at a value of −70.43 dBm which corresponded to the PIM of the bias tee 602. The second fault detected by the test apparatus is located at a distance of 7.629 m with a value of −66.92 dBm which corresponds to the PIM of the high power load 604. Also displayed in FIG. 7 is a line plot of PIM versus distance. This line plot is generated by the Modified Covariance Estimator algorithm discussed above.

Figure 8:
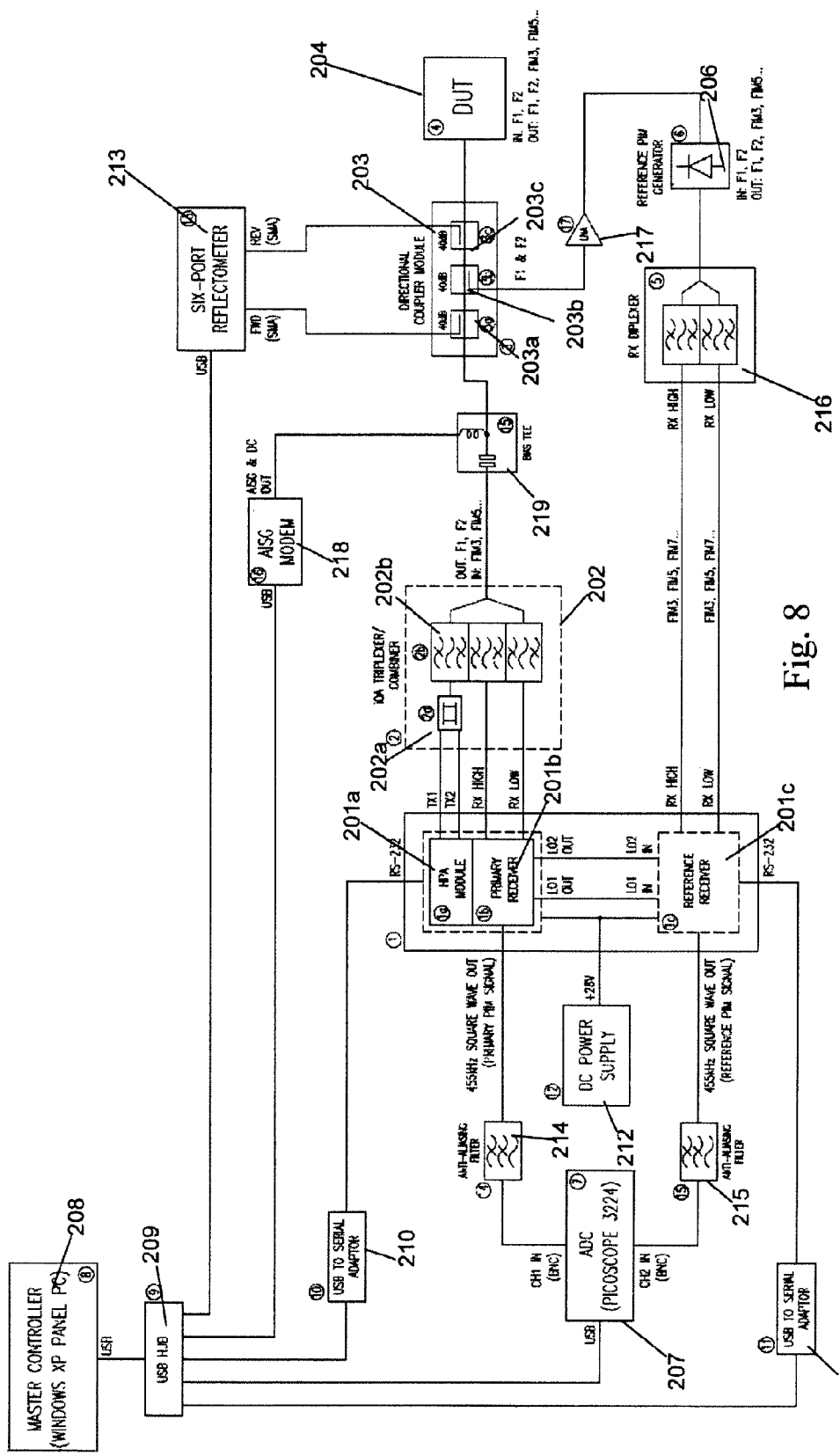
FIG. 8 is a schematic diagram of the test apparatus according to another embodiment of the present invention.

With reference to FIG. 8 there is shown one arrangement of the test apparatus 100 according to a further embodiment of the present invention. In this instance the hardware configuration is substantially similar to that discussed in relation to FIG. 2 above. Namely the interconnections between Control and communications subsystem composed of modules 208, 209, 210, 211, a Primary transceiver stack including HPA and receiver modules 201a, 201b and triplexer/combiner module 202, Directional coupler module 203, Reference receiver 201c, Data acquisition subsystem 207, 214, 215 and a Reflectometer 213 remain essentially the same. However, there are some structural differences in the reference PIM generating subsystem 206. In addition to this the inclusion of an AISG modem 218 and bias tee 219 also necessitated minor changes in the interconnection of the primary transceiver stack and directional coupler 203

As shown the Triplexer 205 in the reference PIM subsystem in this example has been replaced with an Rx diplexer 216 with greatly relaxed RF specifications. The reference PIM generator 206 is now a two-port device coupled between the RX diplexer 216 and the forward directional coupler 203b. As depicted the forward directional coupler 203b is coupled to the reference PIM generator 206 via LNA 217. The reverse isolation of the LNA 217 in this case prevents reference PIM products from coupling back into the primary receiver 201b.

The inclusion of the AISG modem 218 enables the test apparatus to power up active devices such as masthead amplifiers and smart antennas during testing. Such functionality is desirable, as the PIM properties of active devices can vary significantly between their on and off states. In addition to this the AISG modem allows the device to alter antenna properties such as downtilt and azimuth angles during testing. This is useful in situations where antenna PIM is a function of beam angle, either due to internal or external PIM sources. In this particular example the AISG modem 218 is coupled to the master controller 208 via a USB link and to bias tee 219 which is attached to the common port of the primary triplexer/combiner 202.

As mentioned above the test apparatus can measure distance to PIM using any PIM product in the receiver's passband, assuming the signal level is above the noise floor of the system. Such products include $IM_3$, $IM_5$, $IM_7$, $IM_9$ etc. There may be situations in which there are advantages to using higher-order products in preference to lower-order products. This is due mainly to differences in the bandwidths covered by each product during a frequency sweep. Specifically, for a given $F_1$ carrier sweep, higher-order PIM products cover a wider bandwidth than lower-order products (assuming all products are measured at frequencies below $F_1$ & $F_2$). Given that spatial resolution is inversely related to bandwidth, in theory it should be possible to obtain better spatial resolution using higher-order products.

An example of the application of this concept is as follows. Firstly, consider a swept $IM_3$ measurement performed in the PCS receive band with $F_1$ being swept between 1950-1960 MHz and $F_2$ being fixed at 2010 MHz. The resultant $IM_3$ products will be contained the 1890-1910 MHz band i.e. a total $IM_3$ bandwidth of 20 MHz, with a spatial resolution in a noise-free system of approx 6.2 metres, assuming an 82% velocity factor.

Consider a similar scenario for $IM_7$ products with $F_1$ being swept between 1950-1960 MHz and $F_2$ fixed at a frequency of 1980 MHz. The resultant $IM_7$ products will be contained the 1860-1900 MHz band, giving a total $IM_7$ bandwidth of 40 MHz, with a spatial resolution in a noise-free system of 3.1 metres, assuming an 82% velocity factor. Consequently, for the same 10 MHz sweep of the $F_1$ carrier, the $IM_3$ measurement provides a spatial resolution of 6.2 metres (excluding any spectral estimation software enhancements), whereas the $IM_7$ measurement has a resolution of 3.1 metres, i.e. half that of the $IM_3$ result.

The limiting factor in this strategy is signal-to-noise ratio (SNR). Each higher-order PIM product is usually 20-30 dB weaker than the next lower product. This means that the increased bandwidth ratio of high-order PIM measurements comes at the expense of degraded SNR, which in turn is detrimental to the accuracy of the system. However, this problem can be mitigated to some extent by exploiting the possibilities of digital processing gain. For example, a 3 dB improvement in SNR can be achieved by taking twice as many samples of the 455 kHz primary & reference PIM signals. A 6 dB improvement can be obtained by taking four times as many samples, and so forth.

Figure 9:
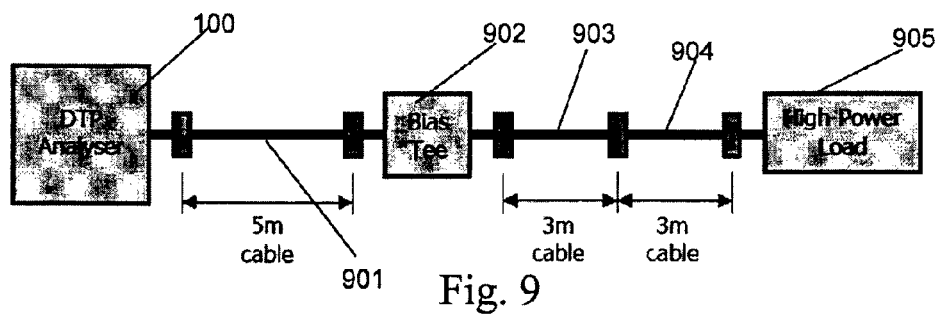
FIG. 9 is a schematic diagram of an experimental arrangement for the detection of PIM sources at varying distances from the test apparatus of FIG. 2

Another arrangement for the measurement of the $IM_3$, $IM_5$ and $IM_7$ with the apparatus of FIG. 2 is shown in FIG. 9. As shown the test apparatus 100 is coupled to a bias tee 902 via a 5 m length of cable 901. The bias tee 902 in this case was then coupled to a first section 903 of cable 3 m in length which in turn was connected to the high power load 905 via a second section 904 of cable of 3 m in length (i.e. total distance between load and the test apparatus being 11 m). As will be appreciated by one of skill in the art such physical interconnects between cables can also act as sources of PIM if the connection is not properly made or matched. The IM3 ratings for the tee 902 and the high power load 905 are approximately −60 to −70 dBm at a carrier power level of +38 dBm per carrier.

The test conditions for the $IM_3$ measurement were as follows: The power of the $Tx_1$ and $Tx_2$ carriers was set to +36 dBm per carrier. $Tx_1$ was swept across a bandwidth of 2000-2030 MHz in 0.25 MHz increments with $Tx_2$ being fixed at a frequency of 2150 MHz. This produced an IM3 signal that swept from 1850-1910 MHz in 0.5 MHz increments.

The test conditions for the $IM_5$ measurement were as follows: The power of the $Tx_1$ and $Tx_2$ carriers was set to +36 dBm per carrier. $Tx_1$ was swept across a bandwidth of 2050-2069.8 MHz in 0.2 MHz increments with $Tx_2$ being fixed at a frequency of 2150 MHz. This produced an IM5 signal that swept from 1850-1909.4 MHz in 0.6 MHz increments.

The test conditions for the IM7 measurement were as follows: The power of the $Tx_1$ and $Tx_2$ carriers was set to +40 dBm per carrier. Tx, was swept across a bandwidth of 2075-2090 MHz in 0.15 MHz increments with $Tx_2$ being fixed at a frequency of 2150 MHz. This produced an IM7 signal that swept from 1850-1910 MHz in 0.6 MHz increments.

A reflection coefficient sweep was also carried out in order to identify any VSWR faults in the system. The test conditions for the reflection coefficient measurement were as follows: The Tx, carrier power was set to +36 dBm. The $Tx_2$ carrier was turned off. $Tx_1$ was swept across a bandwidth of 1930-1990 MHz in 0.5 MHz increments. The reflection coefficient was measured at each frequency point using the six-port reflectometer 213.

Figure 10A:
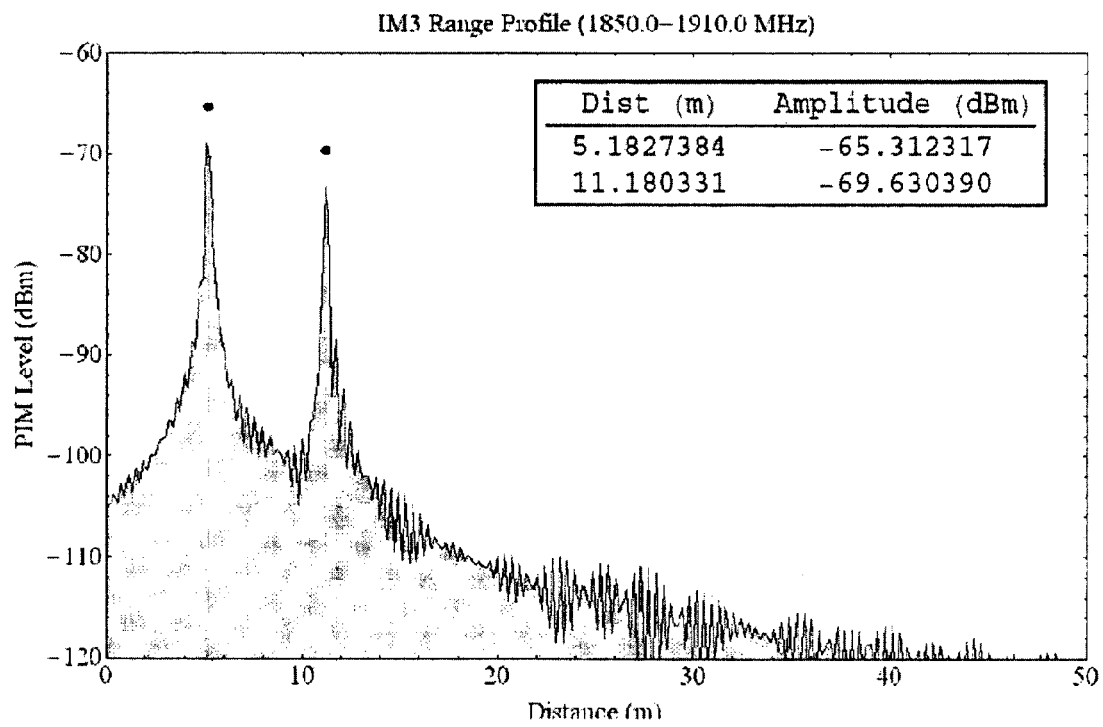
FIGS. 10A-10D are plots of the results of the experiment utilising the arrangement of FIG. 9.

The results of these four tests are presented in FIGS. 10A through 10D. FIG. 10A depicts the range profile for the $IM_3$ products, the dots displayed on the plot represent the PIM associated with the bias tee 902 and the high power load 905. As shown the plot output from the test apparatus places the PIM from the bias tee at a distance of 5.182 m at −65.31 dBm, while the PIM produced by the high power load 905 is determined to be at a distance of 11.18 m at −69.63 dBm.

Figure 10B:
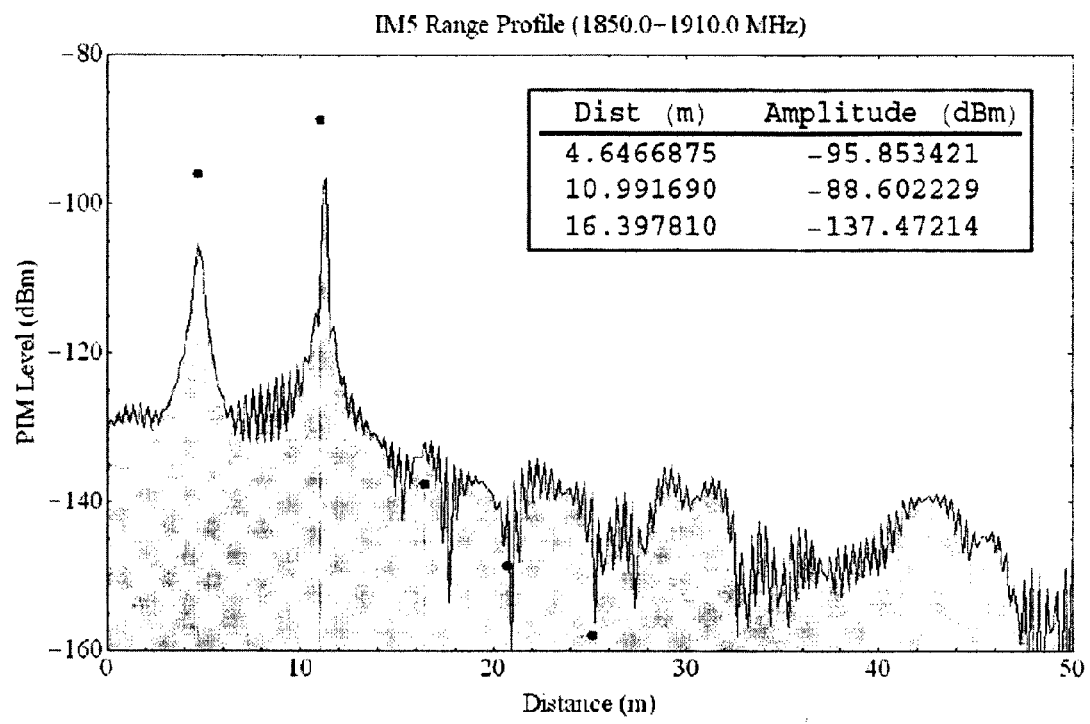

The range profile for the $IM_5$ products is shown in FIG. 10B. Once again the system places the PIM associated with the bias tee at a distance of 4.64 m at a value of −95.85 dBm. Similarly the PIM associated with the high power load is detected at a distance of 10.99 m at a value of −88.60 dBm. In addition to this a number of low-level spurious (or "ghost") PIM responses are also detected, the first of these being at a distance of 16.39 m which is beyond the physical range of the system under test. These spurious responses suggest that there may be impedance mismatches in the device under test which are being interpreted as additional PIM sources.

Figure 10C:
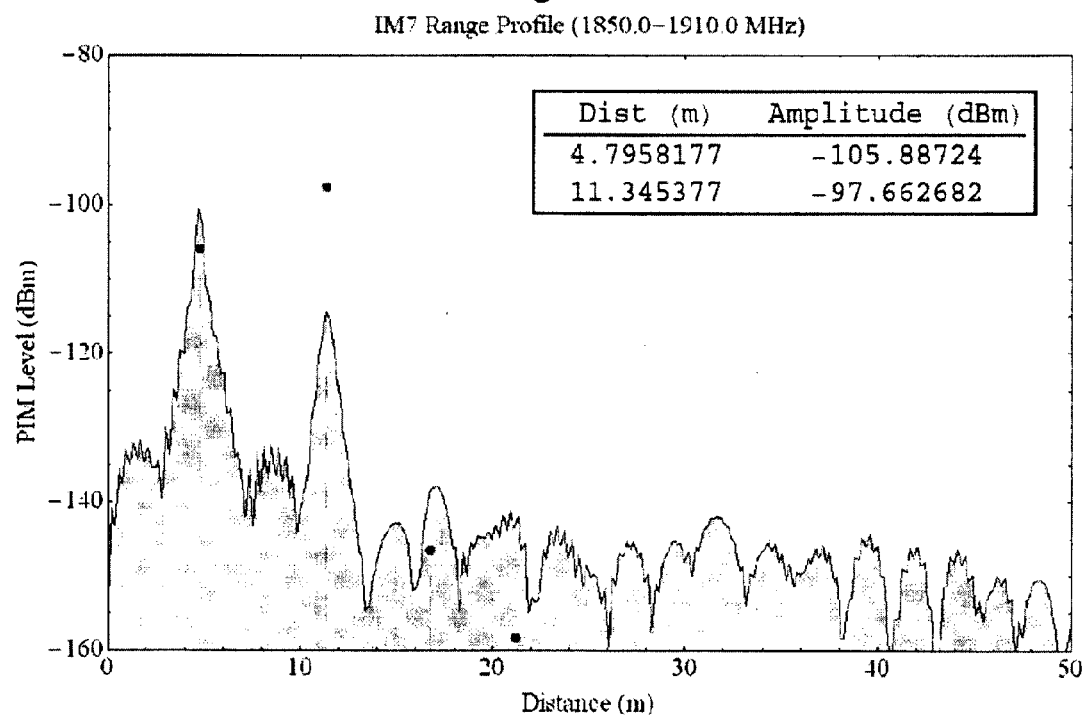

FIG. 10C depicts the range profile for the IMS products measured by the test apparatus 100. As shown the PIM associated with the bias tee is placed at a distance of 4.796 m with a value of −105.89 dBm, while the PIM associated with the high power load being located at 11.34 m with a value of −97.66 dBm. As was the case for the $IM_5$ measurements, a number of low-level spurious PIM sources have also been detected.

The appearance of the spurious responses in FIGS. 10B and 10C indicates that there could be one or more impedance mismatches in the device under test, and perhaps even in the test apparatus itself. This is confirmed when the return loss range profile of the system is examined.

Figure 10D:
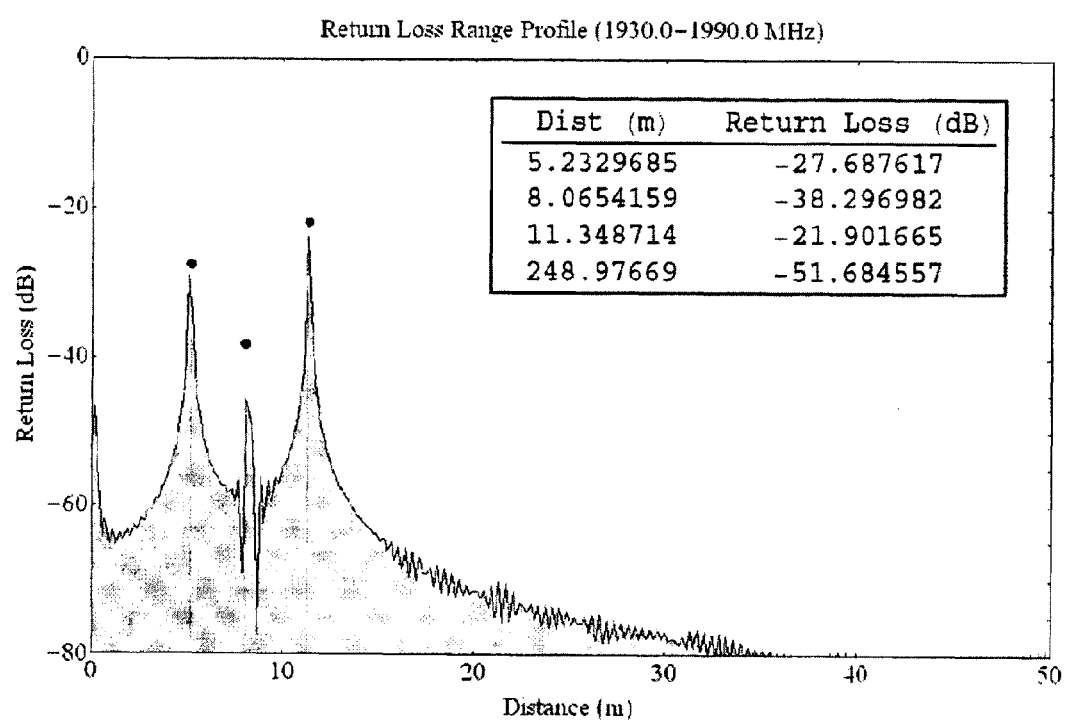

A plot of the return loss range profile over the frequency band of 1930-1990 MHz (i.e.

the transmit band for PCS) is shown in FIG. 10D. As shown the apparatus detects 3 main points of return loss, the first being located at 5.23 m from the apparatus at a value of −27.69 dB which corresponds to the bias tee 902. The second point of return loss being located at a distance of 8.07 m at a value of −38.29 dB which corresponds to the position of the joint between the two sections 903, 904 of cable. Finally the third main point of return loss is placed by the apparatus at a distance of 11.35 m with a value of 21.90 dB which corresponds to the high power load 905.

If we assume that the test apparatus itself has an output return loss of approximately 20 dB (which is typical for this system), then it is possible to explain all of the spurious PIM faults in FIGS. 10B and 10C in terms of multiple reflections between the bias tee, high power load and the instrument's test port.

Figure 11:
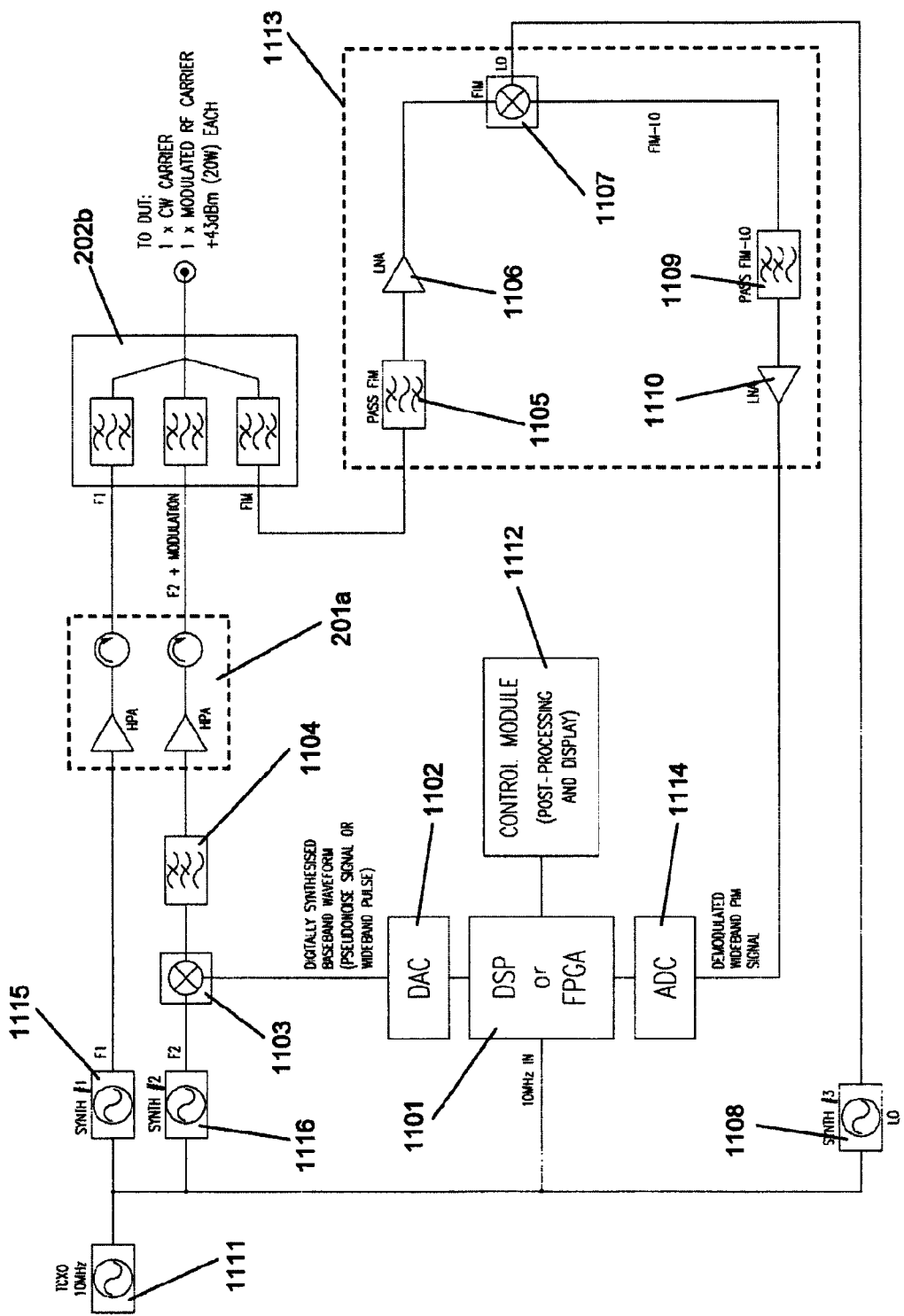
FIG. 11 is a schematic diagram of the test apparatus according to a further embodiment of the invention.

A further possible architecture of the test apparatus 100 is shown in FIG. 11. For the purposes of clarity of description a number of modules such as the six-port reflectometer etc have been omitted from FIG. 11. Accordingly the following discussion will focus primarily on the majority points of difference in the generation of the test signals and reference signals required to produce the distance to PIM measurement. Consequently the omission of one or more features from the architectures of FIGS. 2 and 8 in this instance does not preclude its inclusion in the architecture shown in FIG. 11.

The main difference with apparatus of FIG. 11 and those discussed in relation to FIGS. 2 and 8 above is that it contains only one receiver, and does not require a reference PIM generating subsystem. Instead, a wideband signal is digitally synthesised inside an FPGA (or similarly high-performance digital processing module) 1101 and output via a high-speed digital to analogue converter (DAC) 1102. Examples of wideband signals include spread-spectrum pseudonoise signals, and trains of extremely short duration pulses. A digitally synthesised wideband signal can be tailored to have as wide a bandwidth as necessary (anywhere up to 60 MHz in this application), subject to the spectrum allocation of the communications network under test.

The wideband signal is modulated onto one of the high-power carriers $Tx_1$ or $Tx_2$ using a single-stage upconverter 1103 coupled to the output of the DAC 1102. The output from the upconverter 1103 then passed through a lowpass filter 1104 in order to reject the unwanted sideband of the upconverted signal's spectrum, before being fed to the HPA module 201a. In contrast to the architectures of FIGS. 2 and 8, in this embodiment it is not necessary to sweep the frequency of either of the two Tx carriers. This is a consequence of the wideband modulation on one carrier: the resultant PIM signal generated in the device under test also has a wideband spectrum, thereby providing information across a range of frequencies instantaneously.

The PIM generated in the DUT 204 by $Tx_1$ and $Tx_2$ is downconverted back to baseband in the receiver 1113, and then digitised using a high-speed ADC 1114. As shown the received signal from triplexer 202b in this case is fed to bandpass filter 1105. The output of this filter is then passed to an LNA 1106 before being downconverted in a single-stage downconverter 1107 using a local oscillator signal provided from programmable PLL frequency synthesiser 1108. The output of downconverter 1107 is then lowpass filtered 1109 and then passed through LNA 1110, after which it is digitised by a high-speed ADC 1114.

The amplitude and phase characteristics of the digitised PIM signal are calculated in software by comparing it to the original baseband signal synthesised inside the FPGA. The location and magnitude of each PIM source in the device under test can then be estimated by the control module 1112, using the same signal processing algorithm as the other embodiments of the test apparatus.

Note that in this embodiment it is necessary for the PLL frequency synthesisers 1108, 1115, 1116 and FPGA 1101 to share the same 10 MHz timing reference 1111, in order for the measured PIM signal to remain phase locked with the original wideband signal generated in the FPGA. Furthermore, it is advisable to use synthesisers which allow the phase of the RF output signals to be held constant from sweep to sweep, in order to avoid a ±180° phase ambiguity in the measured PIM phase. A suitable example of such a synthesiser is the ADF4350 from Analog Devices.

The advantage of this method is that it enables wideband vector PIM measurements to be made in a near-instantaneous burst. This is especially helpful in locating unstable or transient PIM sources, where a frequency-stepped CW sweep would be too slow to capture the PIM signals before they decayed to zero. The two chief limitations of this method are: higher ADC and DAC sampling rates are required, which raises the cost of the system for a given number of bits of resolution; and the signal to noise ratio of the measured PIM signal is likely to be worse than that of a frequency-stepped CW system, due to the fact that the power spectral density of the original high-power wideband carrier will necessarily be lower than what can be achieved with a CW-based approach (although this limitation can be offset to some extent by the effects of digital processing gain). A further limitation is the compression point of the HPA module. This is due to the fact that wideband signals can have very large peak-to-average ratios, which can result in HPAs being driven into compression for brief instants of time during the signal's period. This undesirable phenomenon creates intermodulation products in the HPA itself, which can mask the PIM from the device under test that the apparatus is trying to measure. In order to prevent this from occurring, the wideband stimulus signal must be tailored in such a way that its peak to average ratio is constrained to an acceptable level.

Figure 12:
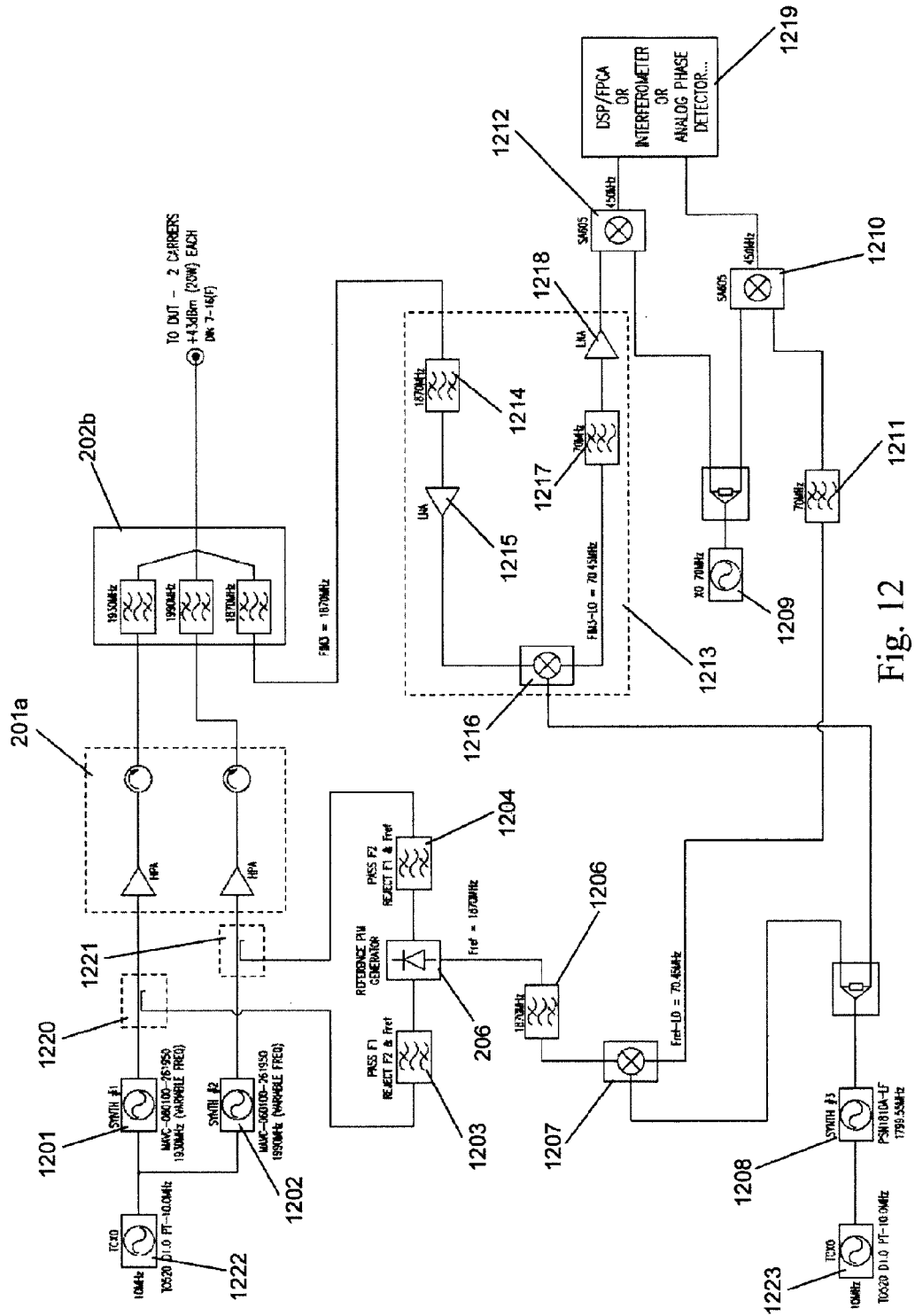
FIG. 12 is a schematic diagram of the test apparatus according to another embodiment of the invention.

A further alternate architecture of the test apparatus 100 to that discussed above in relation to FIGS. 2, 8 and 11 is shown in FIG. 12. For the purposes of clarity of description a number of modules such as the control module etc have been omitted from FIG. 12. Accordingly the following discussion will focus primarily on the majority points of difference in the generation of the test signals and reference signals required to produce the distance to PIM measurement. Consequently the omission of one or more features from the architectures of FIGS. 2, 8 and 11 in this instance does not preclude its inclusion in the architecture shown in FIG. 12.

As shown, the reference PIM signal is derived by sampling the two carriers at the outputs of the Tx$_1$ & Tx$_2$ synthesisers 1201, 1202 rather than at the triplexer 202b output port. The sampled signals are supplied to a reference PIM generator 206 via bandpass filters 1203, 1204. This results in a large number of PIM products emerging from the output port of the reference PIM generator 206, as well as an attenuated version of the original carriers Tx$_1$ & Tx$_2$. This spectrum of frequencies is bandpass filtered in an RF SAW filter in order to reject those PIM products that fall outside the receive band of the test apparatus. The resultant in-band PIM signals are then downconverted to 70.455 MHz by means of a mixer 1207. The local oscillator port of mixer 1207 is driven by a programmable PLL frequency synthesiser 1208.

The 70.455 MHz output signal from mixer 1207 is lowpass filtered in IF SAW filter 1211 in order to reject the mixer's image band and any other unwanted mixing products. The filtered signal is then downconverted to 455 kHz in a second mixer 1210. The local oscillator signal of mixer 1210 is obtained from a fixed-frequency synthesiser 1209 with a power divider on its RF port.

The 455 kHz output signal from mixer 1210 is the reference PIM signal for the test apparatus. It is processed inside a detection module 1219 which could take a range of forms, including a DSP, FPGA, interferometer or I/Q demodulator.

The primary PIM signal created in the device under test passes through the triplexer 202b into bandpass filter 1214 within the receiver module 1213. The output of filter 1214 is then passed to an LNA 1215 before being downconverted in mixer 1216. The local oscillator port of mixer 1216 is driven by a programmable PLL synthesiser 1208, the same synthesiser used by the first mixer 1207 in the reference receiver. This ensures that the primary and reference PIM signals remain phase locked to each other.

The output of mixer 1216 is then lowpass filtered in IF SAW filter 1217 in order to reject the mixer's image band and any other unwanted mixing products. The 70.455 MHz output signal is then passed through LNA 1218 before being downconverted to 455 kHz in a second mixer 1212. The local oscillator signal of mixer 1212 is obtained from a fixed-frequency synthesiser 1209 with a power divider on its RF port, the same synthesiser used by the second mixer 1210 in the reference receiver. This ensures that the primary and reference PIM signals remain phase locked to each other.

The 455 kHz output signal from mixer 1212 is the downconverted primary PIM signal. It is processed inside detection module 1219 in order to compare its amplitude and phase with that of the reference PIM signal.

The advantage of the architecture of FIG. 12 is that a high-power low-PIM directional coupler module is not required. Instead, low-power surface-mount directional couplers can be fitted directly to the HPA board. An example of such a device is the Anaren Pico Xinger 1P510S. Note that this benefit comes at the price of increased sensitivity to drift; that is, any drift in the phase response of the HPAs 201a or triplexer 202b is not tracked by the reference PIM signal, as it is in the architectures of FIGS. 2 & 8.

Figure 14:
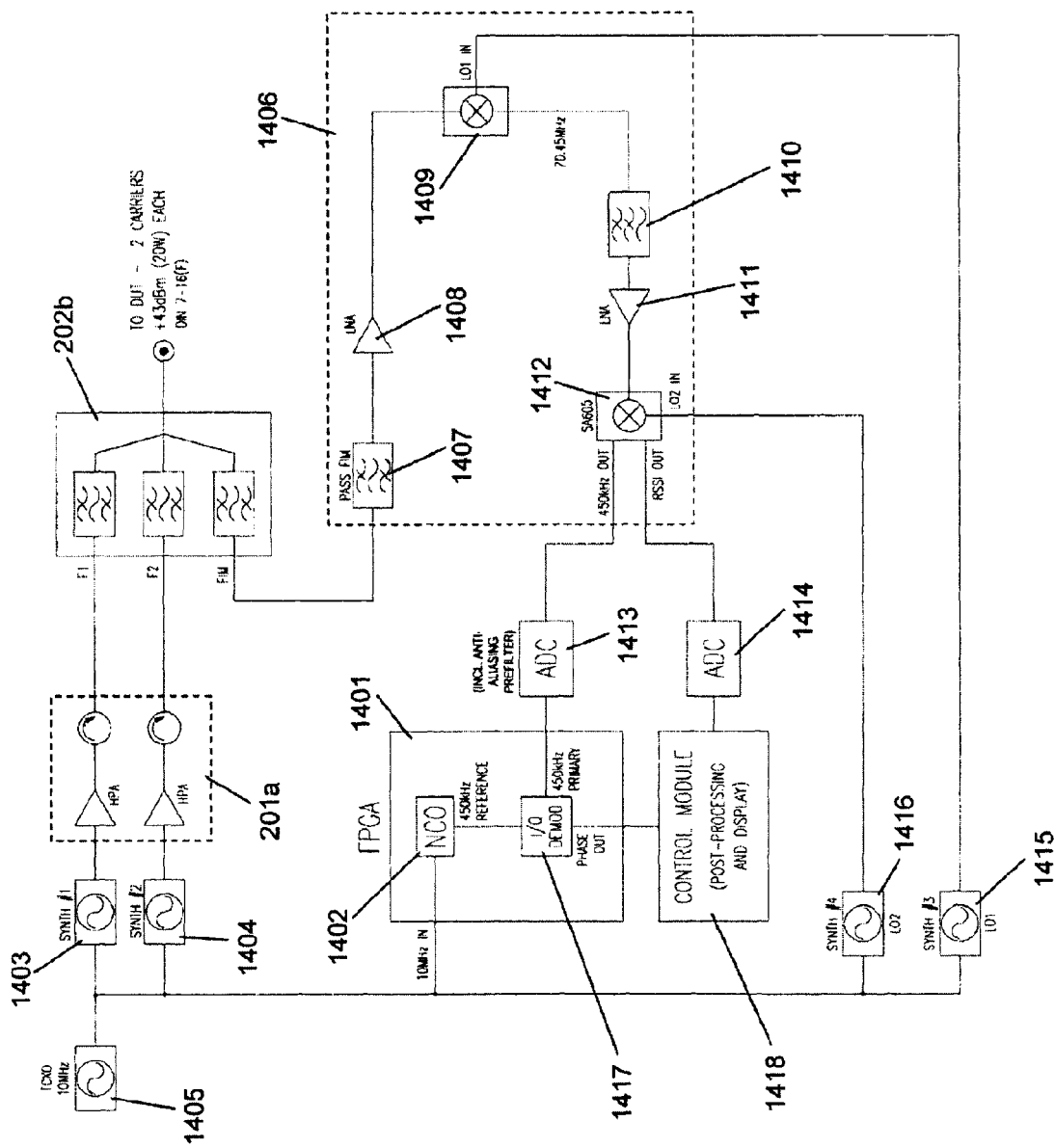
FIG. 14 is a schematic diagram of the test apparatus according to another embodiment of the invention.

Yet another possible architecture of the test apparatus 100 is shown in FIG. 14. For the purposes of clarity of description a number of modules such as the six-port reflectometer etc have been omitted from FIG. 14. Accordingly the following discussion will focus primarily on the majority points of difference in the generation of the test signals and reference signals required to produce the distance to PIM measurement. Consequently the omission of one or more features from the architectures of FIGS. 2 and 8 in this instance does not preclude its inclusion in the architecture shown in FIG. 14.

The main differences between apparatus of FIG. 14 and those discussed in relation to FIGS. 2 and 8 above are that it contains only one receiver, and does not require a reference PIM generator circuit. Instead, a 455 kHz reference signal is digitally synthesised inside an FPGA (or similarly high-performance digital processing module) 1401 by means of a numerically controlled oscillator (NCO) 1402. NCOs can take a variety of forms, but in this example the NCO is simply a processing block in the FPGA firmware that generates a fixed-frequency sine wave of known amplitude and phase, using an external 10 MHz signal 1405 as its timing reference.

As is the case for the architectures of FIGS. 2 and 8 above, the apparatus of FIG. 14 generates a pair of CW carriers by means of two PLL synthesisers 1403, 1404. The two carriers are each boosted to a power level of +43 dBm in the HPA module 201a, before being combined onto a single RF output port in the triplexer 202b. The two carriers propagate into the device under test, where PIM is generated by the faulty devices therein.

The PIM signal created in the device under test passes through the triplexer 202b and into the bandpass filter 1407 within the receiver module 1406. The output of filter 1407 is then passed to an LNA 1408 before being downconverted to 70.455 MHz in mixer 1409. The local oscillator port of mixer 1409 is driven by a programmable PLL synthesiser 1415. The output of mixer 1409 is then lowpass filtered in IF SAW filter 1410 in order to reject the mixer's image band and any other unwanted mixing products. The 70.455 MHz output signal is then passed through LNA 1411 before being downconverted to 455 kHz in a second mixer 1412. The local oscillator signal of mixer 1412 is obtained from a fixed-frequency synthesiser 1416.

The second mixer 1412 produces two outputs: an RSSI signal and a 455 kHz square wave. The RSSI signal is a DC voltage proportional to the power of the PIM signal in dBm. This signal is digitised by an ADC 1414 and stored in the control module 1418 in readiness for post-processing.

The 455 kHz output signal from mixer 1412 is a clipped version of the PIM signal, which contains the same phase information but with the amplitude content removed. This signal is digitised by an ADC 1413 which suitably includes an anti-aliasing prefilter to avoid introducing aliasing artefacts into the sampled data sequence. The digitised PIM signal is sent to the FPGA 1401, where its phase characteristics are determined by comparing it to the 455 kHz reference signal from the NCO 1402. This phase comparison would typically be performed with a digital I/Q demodulator 1417, which in this example is simply another processing block in the FPGA firmware. The calculated phase offset is sent to the control module 1418 in readiness for post-processing.

Upon completion of the frequency sweep the location and magnitude of each PIM source in the device under test is computed by the control module 1418 using the same signal processing algorithm as the other embodiments of the test apparatus.

Note that in the embodiment of FIG. 14 it is necessary for the PLL frequency synthesisers 1403, 1404, 1415, 1416 and FPGA 1401 to share the same 10 MHz timing reference 1405, in order for the measured PIM signal to remain phase locked with the reference signal generated in the NCO 1402. Furthermore, it is advisable to use synthesisers which allow the phases of the RF output signals to be held constant from sweep to sweep, in order to avoid a ±180° phase ambiguity in the measured PIM phase. An example of such a synthesiser is the ADF4350 from Analog Devices.

The architecture of FIG. 14 has several advantages. Firstly, it does not require a directional coupler, reference PIM generator, reference diplexer/triplexer or reference receiver, resulting in a simpler and more reliable system. Secondly, the reference signal produced by the NCO has lower phase noise than one generated by analogue hardware, being affected only by the jitter in the 10 MHz timing reference 1405 and the finite precision of the FPGA's arithmetic. Finally, the architecture of FIG. 14 can potentially measure PIM products of much higher order than would be possible with the systems of FIGS. 2 and 8. This is due to the fact that the SNR of the reference signal from the NCO 1402 is independent of the order of the PIM product being measured, since its frequency is fixed at 455 kHz at all times. By contrast, the power level of a reference PIM signal generated in the mixer-based circuit of FIGS. 2 and 8 varies greatly from PIM product to PIM product. As a result, the SNR of the reference PIM signal degrades as the order of PIM product increases, limiting the maximum order of PIM signal that the system can measure reliably. (Of course, this limitation could be mitigated to some extent by using a different reference PIM generator design, such as a step-recovery diode or nonlinear transmission-line device. However, the phase-noise performance would still be inferior to the NCO-based approach, while the hardware complexity would be equal to or greater than the mixer-based approach.)

While the above discussion contemplates the use of a stand alone test apparatus to locate PIM faults within a cable network, it will be appreciated by those skilled in the art that the functionality. of the test apparatus could be readily integrated into a remote radio head, for the purposes of self-testing and fault diagnosis. A remote radio head is essentially an ultra-compact cellular base station. It contains everything from an RF transceiver and antennas to a digital interface. Its basic function can be summed up as "optical fibre in, RF out".

Like all cellular base stations, remote radio heads are vulnerable to PIM. Unlike conventional systems, however, all of the radio equipment in a remote radio head is mounted at the top of the antenna mast. Consequently, diagnosing PIM faults in such systems is inherently more difficult, due to the need for the testing personnel to carry their test instruments to the top of the mast in order to troubleshoot the source of the problem.

In principle, all of the hardware in the test apparatus discussed above could be integrated into the RF transceiver of a remote radio head. Indeed, most of the necessary hardware is already present, including frequency-agile signal source; RF power amplifier; low noise floor receiver; and high-speed digital back end. With a relatively small number of modifications, the remote radio head could be equipped with the ability to automatically pinpoint any PIM faults in the cell site, and raise an alarm with the Network Operations Centre.

The majority of the above discussion focuses on the use of the test apparatus to detect sources of PIM within the communications network. However the test apparatus could be utilised to locate PIM faults in a range of other contexts, not just within coaxial cable networks. One example is the detection of external PIM faults.

As the name implies, external PIM faults are caused by PIM-generating objects outside the base station. They are created when high-power transmit signals from the base station's antennas illuminate a PIM source somewhere in the cell. Such PIM sources include galvanised iron water tanks, chain link fences, guttering on rooftops, and many more. When irradiated by RF power from the base station, these objects re-radiate PIM in all directions, including back towards the base station. In extreme cases, this PIM can be high enough to degrade the receiver sensitivity in the BTS.

In principle, the test apparatus could be used to locate external PIM sources. In its current form the system will reveal the distance to the external PIM source(s), but not their direction. However, if the downtilt and azimuth angles of the base station's Tx & Rx antennas can be varied using a built-in AISG modem as discussed above, then in principle the test apparatus can estimate cross-range information as well as downrange information, thereby giving both the distance and bearing of each external PIM fault relative to the BTS.

The theoretical maximum alias-free range of the test apparatus is approximately 30 km, assuming that measurements are performed by sweeping the $F_2$ carrier and measuring the $IM_3$ product below carrier frequencies $F_1$ and $F_2$. The alias-free range is a function of the minimum frequency increment at which the $F_2$ carrier can be stepped, which for the current invention is 5 kHz.

When attempting to pinpoint external PIM faults, some uncertainty in the measured results will be unavoidable. This is due to the fact that the velocity factor of the feeder cable in a base station is different to that of air. In percentage terms, the ranging error will be of the same order of magnitude as the difference between the velocity factors of the two media, typically 10-20% in practice. While this uncertainty sounds large, in many cases it should be possible to narrow down the list of PIM suspects using the direction-finding strategy mentioned above.

Figure 13:
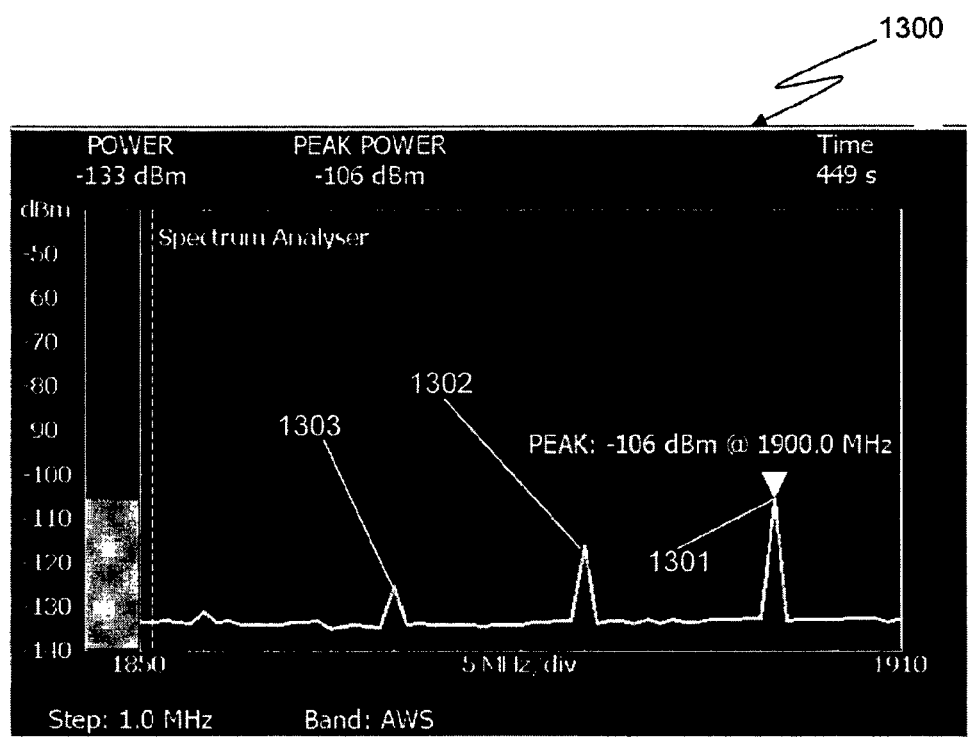
FIG. 13 depicts a screen capture of the test apparatus operating in a spectrum analyser mode.

FIG. 13 depicts a screen capture 1300 of the test apparatus operating in what the applicant has termed a spectrum analyser mode. In this instance the two test signals are fixed in frequency while the primary receiver is swept across all or part of the receive bandwidth of the system under test. The resultant received signals are displayed in terms of the amplitude of the received PIM signals in dBm versus frequency. This has the effect of showing the PIM products which fall within the receive band of the system under test. In screen capture of FIG. 13 the IM products 1301, 1302 and 1303 from a system under test resulting from two +43 dBm test signals at 1930 & 1945 MHz are shown. The 5th order product 1301 is positioned at 1900 MHz (i.e. 3×1930 2×1945=1900), 7th 1302 positioned at 1885 MHz (i.e. 4×1930−3×1945=1885) and 9th order product 1303 positioned at 1875 MHz (i.e. 5×1930−4×1945=1870). While in this particular example the 3rd order product is not displayed it will be appreciated by those of skill in the art that the 3rd order product can easily be displayed by utilising a different frequency separation between the test tones applied to the system under test.

One advantage of utilising such a test mode is that it allows RF effects such as corona or arcing, which can occur at some cellular base station sites, to be more easily detected without the need for an external spectrum analyser. It also allows the user to test for the presence of external, non-PIM-related interferers in the receive band of the apparatus prior to the commencement of PIM testing. This helps avoid the risk of false PIM failures being reported by the instrument.

It is to be understood that the above embodiments have been provided only by way of exemplification of this invention, and that further modifications and improvements thereto, as would be apparent to persons skilled in the relevant art, are deemed to fall within the broad scope and ambit of the present invention described herein.

The invention claimed is:

1. A test apparatus, said apparatus including:
a primary transceiver module including:
a high power amplifier module for providing a pair of test signals wherein at least one of the test signals is swept over a predetermined frequency range;
a combiner module for applying the test signals to a test medium; and
a primary receiver coupled to the combiner module for reception of a plurality of primary return signals produced by the test medium in response to the test signals;
a directional coupler module coupled between the combiner module and the test medium;
a reference signal generation module, said reference signal generation module including:
a filter module coupled to the directional coupler module, said directional coupler module providing a pair of reference test signals corresponding to the pair of test signals produced by said high power amplifier module; and
a reference signal generator for producing a plurality of reference signals based on the pair of reference test signals;
a reference receiver coupled to the filter module for receiving a plurality of reference signals from the reference signal generator;
an analog to digital converter coupled to the primary receiver and the reference receiver, said analog to digital converter producing a first set of digital signals from the plurality of primary return signals and a second set of digital signals from the plurality of reference signals; and
at least one processor coupled to the analog to digital converter wherein said at least one processor is adapted to:
determine amplitudes for each signal within the first set of digital signals and the second set of digital signals;
calculate phase offsets between each signal in the first set of digital signals and the second set of digital signals;
combine the amplitude and phase measurements for each signal in the first set of digital signals and the second set of digital signals into a single vector;
estimate from the single vector a number of passive intermodulation sources within the test medium;
determine for each passive intermodulation source its magnitude and location within the test medium; and
display the magnitude and location of each passive intermodulation source within the test medium.

2. The test apparatus of claim 1, wherein said apparatus further includes a pair of frequency synthesizers coupled to the high power amplifier module, for production of test signals in different communications bands.

3. The test apparatus of claim 1, wherein the primary receiver includes a two-stage down converter.

4. The test apparatus of claim 1, wherein said apparatus further includes a reflectometer coupled between the directional coupler module and the at least one processor.

5. The test apparatus of claim 4, wherein the reflectometer is a six port reflectometer.

6. The test apparatus of claim 1, wherein the combiner module includes a hybrid combiner and a filtering element.

7. The test apparatus of claim 6, wherein the filtering element is a diplexer.

8. The test apparatus of claim 6, wherein the filtering element is a triplexer.

9. The test apparatus of claim 1, wherein the combiner module comprises a filtering element, said filtering element being a quadruplexer.

10. The test apparatus of claim 1, wherein the directional coupler module includes at least one reverse coupler and at least two forward couplers.

11. The test apparatus of claim 10, wherein the reverse coupler and at least one forward coupler are coupled to a reflectometer.

12. The test apparatus of claim 10, wherein at least one forward coupler is coupled to the filter module.

13. The test apparatus of claim 1, wherein the filter module is a triplexer.

14. The test apparatus of claim 1, wherein the filter module is a diplexer.

15. The test apparatus of claim 1, wherein the filter module is a band pass filter.

16. The test apparatus of claim 1, wherein the reference signal generator is coupled to the directional coupler module via a Low Noise Amplifier.

17. The test apparatus of claim 1, wherein sweeping the at least one test signal's frequency includes incrementally increasing the frequency of the at least one test signal.

18. The test apparatus of claim 17, wherein the frequency of the at least one test signal is incremented in frequency steps of 0.25 MHz.

19. The test apparatus of claim 1, wherein the primary receiver and reference receiver are each coupled to the analog to digital converter by anti-aliasing filters.

20. The test apparatus of claim 19, wherein the anti-aliasing filters are lowpass filters.

21. The test apparatus of claim 1, wherein said apparatus further includes a bias tee, a direct current ("DC") power supply unit and an Antenna Interface Standards Group ("AISG") modem attached to a test port of the apparatus, whereby active devices in a communications network under test can be powered during testing.

22. The test apparatus of claim 21 wherein the AISG modem is utilized to change down-tilt and azimuth angles of at least one AISG-enabled antenna connected to the test port of the apparatus during testing.

23. The test apparatus of claim 1 wherein the at least one processor adapted to estimate of the number of passive intermodulation sources within the test medium is further adapted to:
  construct a system of linear prediction equations based on the single vector to produce a linear prediction data matrix;
  perform a singular value decomposition on the linear prediction data matrix to produce a set of singular values, wherein the set of singular values defines a magnitude of a largest singular value within the set of singular values; and
  set any singular value within the set of singular values to zero if the singular value is less than 10% of the magnitude of the largest singular value within the set of singular values to produce a set of modified singular values.

24. The test apparatus of claim 23, wherein the at least one processor adapted to determine for each passive intermodulation source its location and magnitude is further adapted to:
  reconstitute a modified linear prediction data matrix using the set of modified singular values;
  determine coefficients of a characteristic polynomial for the modified linear prediction data matrix utilizing a Total Least Squares method;
  calculate roots of the characteristic polynomial using said coefficients;
  calculate the location of each passive intermodulation source from said roots; and
  calculate the magnitude of each passive intermodulation source via a Least Squares Prony method, using said coefficients and roots of the characteristic polynomial.

25. The test apparatus of claim 1, wherein determination of the magnitude and location of each passive intermodulation source within the test medium is performed utilizing a Periodogram Power Spectral Density Estimator.

26. The test apparatus of claim 1, wherein the calculation of the phase offsets includes:
  determining absolute phases for each signal within the first and second set of digital signals by performing a least-squares fit of a sinusoidal function to each signal within the first and second set of digital signals; and
  calculating a difference between the phases of the resultant sinusoidal functions derived from a least-squares process.

27. A method for determining the location and magnitude of sources of passive intermodulation within a test medium said method including the steps of:
  applying a pair of test signals to the test medium wherein at least one of the test signals is swept over a predetermined frequency range;
  receiving a plurality of primary return signals produced by the test medium in response to the test signals;
  generating a pair of reference test signals corresponding to the pair of test signals;
  generating a plurality of reference return signals from the pair of reference test signals;
  compiling a first set of digital signals from the plurality of primary return signals and a second set of digital signals from the plurality of reference signals;
  determining amplitudes for each signal within the first set of digital signals and the second set of digital signals;
  calculating phase offsets between each signal in the first set of digital signals and the second set of digital signals;
  combining the amplitude and phase measurements for each signal in the first set of digital signals and the second set of digital signals into a single vector;
  estimating from single vector a number of passive intermodulation sources within the test medium;
  determining for each passive intermodulation source its magnitude and location within the test medium; and
  displaying the magnitude and location of each passive intermodulation source within the test medium.

28. The method of claim 27, wherein the step of calculating the phase offsets includes:
  determining absolute phases for each signal within the first and second set of digital signals by performing a least-squares fit of a sinusoidal function to each signal within the first and second set of digital signals; and
  calculating a difference between the phases of the resultant sinusoidal functions derived from the least-squares process.

29. The method of claim 27, wherein the step of estimating the number of passive intermodulation source includes:
  constructing a system of forward linear prediction equations based on the single vector to produce a linear prediction data matrix;
  performing a singular value decomposition on the linear prediction data matrix to produce a set of singular values, wherein the set of singular values defines a magnitude of a largest singular value within the set of singular values; and
  setting any singular value within the set of singular values to zero if the singular value is less than 10% of the magnitude of the largest singular value within the set of singular values to produce a set of modified singular values.

30. The method of claim 29, wherein the step of calculating the location and magnitude of each passive intermodulation source includes:
  reconstituting a modified linear prediction data matrix using the set of modified singular values;
  determining coefficients of a characteristic polynomial for the modified linear prediction data matrix utilizing a Total Least Squares method;
  calculating roots of the characteristic polynomial using said coefficients;
  calculating the location of each passive intermodulation source from said roots; and calculating the magnitude of each passive intermodulation source via a Least Squares Prony method, using said coefficients and roots of the characteristic polynomial.

31. The method of claim 27, wherein determining the magnitude and location of each passive intermodulation source within the test medium is performed utilizing a Periodogram Power Spectral Density Estimator.

* * * * *